US012628406B2

(12) United States Patent
Chen et al.

(10) Patent No.: US 12,628,406 B2
(45) Date of Patent: May 12, 2026

(54) PERFORMANCE OPTIMIZATION BY SIZING GATES AND SOURCE/DRAIN CONTACTS DIFFERENTLY FOR DIFFERENT TRANSISTORS

(71) Applicant: Taiwan Semiconductor Manufacturing Company, Ltd., Hsin-Chu (TW)

(72) Inventors: Li-Hui Chen, Hsinchu County (TW); Chun-Hung Chen, Hsinchu (TW); Jhon Jhy Liaw, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 644 days.

(21) Appl. No.: 17/900,639

(22) Filed: Aug. 31, 2022

(65) Prior Publication Data

US 2024/0072137 A1 Feb. 29, 2024

(51) Int. Cl.
*H10D 64/23* (2025.01)
*H10B 10/00* (2023.01)
(Continued)

(52) U.S. Cl.
CPC .......... *H10D 64/258* (2025.01); *H10B 10/125* (2023.02); *H10D 30/611* (2025.01); *H10D 30/6215* (2025.01); *H10D 30/6219* (2025.01); *H10D 86/431* (2025.01); *H10D 86/60* (2025.01); *H10D 89/10* (2025.01)

(58) Field of Classification Search
CPC ............... H10D 64/258; H10D 30/611; H10D 30/6215; H10D 30/6219; H10D 86/431;

H10D 86/60; H10D 89/10; H10D 30/014; H10D 30/43; H10D 30/6735; H10D 30/6757; H10D 62/121; H10D 64/017; H10D 64/256; H10D 84/0158;
(Continued)

(56) References Cited

U.S. PATENT DOCUMENTS 4,970,564 A * 11/1990 Kimura .................. H10B 12/31
257/306
5,208,180 A * 5/1993 Gonzalez ............... H10D 1/714
438/387
(Continued)

FOREIGN PATENT DOCUMENTS

TW 201818548 A 5/2018
TW 202118062 A 5/2021
TW 202213791 A 4/2022

*Primary Examiner* — Maliheh Malek
(74) *Attorney, Agent, or Firm* — Cooper Legal Group, LLC

(57) ABSTRACT

A first transistor includes a first gate, a first source/drain, and a first source/drain contact disposed over the first source/drain. The first gate has a first dimension measured in a first lateral direction. The first source/drain contact has a second dimension measured in the first lateral direction. A second transistor includes a second gate, a second source/drain, and a second source/drain contact disposed over the second source/drain. The second gate has a third dimension measured in the first lateral direction. The second source/drain contact has a fourth dimension measured in the first lateral direction. A first ratio of the first dimension and the second dimension is different from a second ratio of the third dimension and the fourth dimension.

20 Claims, 29 Drawing Sheets

(51) Int. Cl.
    *H10D 30/60*     (2025.01)
    *H10D 30/62*     (2025.01)
    *H10D 86/40*     (2025.01)
    *H10D 86/60*     (2025.01)
    *H10D 89/10*     (2025.01)

(58) Field of Classification Search
    CPC .... H10D 84/038; H10D 84/834; B82Y 10/00;
                         H10B 10/125
    See application file for complete search history.

(56)             References Cited

U.S. PATENT DOCUMENTS

| | | | | |
|---|---|---|---|---|
| 5,290,726 | A * | 3/1994 | Kim | H10B 12/318 |
| | | | | 438/254 |
| 5,973,361 | A * | 10/1999 | Hshieh | H10D 30/0291 |
| | | | | 257/E29.066 |
| 6,300,655 | B1 * | 10/2001 | Ema | H10B 12/488 |
| | | | | 257/306 |
| 7,374,992 | B2 * | 5/2008 | Baars | H10B 12/09 |
| | | | | 438/210 |
| 7,667,271 | B2 * | 2/2010 | Yu | H01L 21/26586 |
| | | | | 438/300 |
| 7,910,453 | B2 * | 3/2011 | Xu | H10D 30/694 |
| | | | | 438/404 |
| 8,193,567 | B2 * | 6/2012 | Kavalieros | H10D 84/0158 |
| | | | | 257/E29.264 |
| 8,377,779 | B1 * | 2/2013 | Wang | H10D 30/024 |
| | | | | 438/269 |
| 8,399,931 | B2 * | 3/2013 | Liaw | H10D 84/0126 |
| | | | | 257/E27.06 |
| 8,605,523 | B2 * | 12/2013 | Tao | G11C 29/24 |
| | | | | 365/194 |
| 8,630,132 | B2 * | 1/2014 | Cheng | G11C 11/419 |
| | | | | 365/189.14 |
| 8,652,894 | B2 * | 2/2014 | Lin | H10D 30/024 |
| | | | | 438/198 |
| 8,686,516 | B2 | 4/2014 | Chen et al. | |
| 8,716,765 | B2 * | 5/2014 | Wu | H01L 21/28506 |
| | | | | 257/288 |
| 8,723,272 | B2 * | 5/2014 | Liu | H10D 30/797 |
| | | | | 257/401 |
| 8,729,627 | B2 * | 5/2014 | Cheng | H10D 84/0193 |
| | | | | 257/330 |
| 8,735,993 | B2 * | 5/2014 | Lo | H10D 30/611 |
| | | | | 438/151 |
| 8,736,056 | B2 * | 5/2014 | Lee | H01L 21/76843 |
| | | | | 257/773 |
| 8,760,948 | B2 * | 6/2014 | Tao | G11C 7/227 |
| | | | | 365/194 |
| 8,772,109 | B2 | 7/2014 | Colinge | |
| 8,785,285 | B2 * | 7/2014 | Tsai | H10D 30/024 |
| | | | | 257/E21.409 |
| 8,816,444 | B2 * | 8/2014 | Wann | G06F 30/398 |
| | | | | 716/110 |
| 8,823,065 | B2 * | 9/2014 | Wang | H10D 30/6219 |
| | | | | 257/745 |
| 8,860,148 | B2 * | 10/2014 | Hu | H10D 30/6211 |
| | | | | 257/369 |
| 9,466,570 | B1 * | 10/2016 | Cheng | H01L 21/76224 |
| 9,666,493 | B2 * | 5/2017 | Hashemi | H01L 21/76251 |
| 10,276,565 | B2 * | 4/2019 | Huang | H10D 84/83 |
| 10,522,423 | B2 * | 12/2019 | Liaw | H10D 84/017 |
| 10,867,997 | B2 * | 12/2020 | Yoon | H10D 84/83 |

| | | | | |
|---|---|---|---|---|
| 2002/0149081 | A1 * | 10/2002 | Goda | H10B 69/00 |
| | | | | 257/E21.679 |
| 2004/0238867 | A1 * | 12/2004 | Park | H10B 12/485 |
| | | | | 257/E21.507 |
| 2006/0189051 | A1 * | 8/2006 | Kim | H10B 41/49 |
| | | | | 257/E21.507 |
| 2009/0068809 | A1 * | 3/2009 | Seo | H01L 21/76897 |
| | | | | 257/E21.585 |
| 2014/0001574 | A1 * | 1/2014 | Chen | H10D 64/01 |
| | | | | 257/410 |
| 2014/0032871 | A1 * | 1/2014 | Hsu | G11C 7/222 |
| | | | | 711/E12.001 |
| 2014/0110755 | A1 * | 4/2014 | Colinge | H01L 21/02381 |
| | | | | 257/E21.409 |
| 2014/0151812 | A1 * | 6/2014 | Liaw | H01L 21/76897 |
| | | | | 438/672 |
| 2014/0153321 | A1 * | 6/2014 | Liaw | G11C 11/413 |
| | | | | 365/154 |
| 2014/0153345 | A1 * | 6/2014 | Kim | G11C 8/08 |
| | | | | 365/189.11 |
| 2014/0177352 | A1 * | 6/2014 | Lum | G11C 7/22 |
| | | | | 365/189.011 |
| 2014/0225122 | A1 * | 8/2014 | Takeya | H10D 30/015 |
| | | | | 257/76 |
| 2014/0233330 | A1 * | 8/2014 | Ko | G11C 11/419 |
| | | | | 365/189.16 |
| 2014/0241077 | A1 * | 8/2014 | Katoch | G11C 7/227 |
| | | | | 365/189.011 |
| 2014/0269114 | A1 * | 9/2014 | Yang | G11C 11/419 |
| | | | | 365/189.16 |
| 2015/0035061 | A1 * | 2/2015 | Yoon | H10D 30/62 |
| | | | | 257/365 |
| 2016/0211251 | A1 * | 7/2016 | Liaw | H10B 10/12 |
| 2017/0117411 | A1 * | 4/2017 | Kim | H10D 84/0188 |
| 2018/0026032 | A1 * | 1/2018 | Yoon | H10D 30/797 |
| | | | | 257/401 |
| 2019/0267494 | A1 * | 8/2019 | Kim | H01L 21/3003 |
| 2020/0227410 | A1 * | 7/2020 | Yoon | H10D 30/797 |
| 2020/0295014 | A1 * | 9/2020 | Yu | H10D 62/021 |
| 2020/0402971 | A1 * | 12/2020 | Liaw | H10B 10/12 |
| 2021/0134796 | A1 * | 5/2021 | Kim | H10D 30/6211 |
| 2022/0077292 | A1 * | 3/2022 | Bae | H10D 64/518 |
| 2022/0102507 | A1 * | 3/2022 | Hsiung | H01L 21/76829 |
| 2022/0165857 | A1 * | 5/2022 | Park | H10D 30/6735 |
| 2022/0189870 | A1 * | 6/2022 | Shin | H01L 21/76831 |
| 2022/0199789 | A1 * | 6/2022 | Kim | H10D 62/151 |
| 2022/0375931 | A1 * | 11/2022 | Huang | H10D 30/62 |
| 2022/0375934 | A1 * | 11/2022 | Park | H10D 30/43 |
| 2022/0384591 | A1 * | 12/2022 | Lee | H10D 84/0149 |
| 2022/0406914 | A1 * | 12/2022 | Lee | H10D 64/256 |
| 2023/0034125 | A1 * | 2/2023 | Wu | H01L 21/7682 |
| 2023/0207627 | A1 * | 6/2023 | Sung | H10D 62/116 |
| | | | | 257/288 |
| 2023/0299136 | A1 * | 9/2023 | Chou | H10D 84/013 |
| | | | | 257/288 |
| 2023/0320058 | A1 * | 10/2023 | Lin | H10D 84/013 |
| | | | | 257/369 |
| 2023/0343699 | A1 * | 10/2023 | Lu | H10D 30/43 |
| 2023/0402535 | A1 * | 12/2023 | Kim | H10D 30/6757 |
| 2023/0420552 | A1 * | 12/2023 | Park | H10D 64/258 |
| 2024/0006409 | A1 * | 1/2024 | Kim | H10D 30/6735 |
| 2024/0021704 | A1 * | 1/2024 | Lee | H10D 64/258 |
| 2024/0072055 | A1 * | 2/2024 | More | H10D 62/151 |
| 2024/0138137 | A1 * | 4/2024 | You | H10D 30/6757 |
| 2025/0063799 | A1 * | 2/2025 | Park | H10D 84/0149 |
| 2025/0070021 | A1 * | 2/2025 | Kim | H10D 64/017 |
| 2025/0081599 | A1 * | 3/2025 | Hwang | H10D 84/8312 |

* cited by examiner

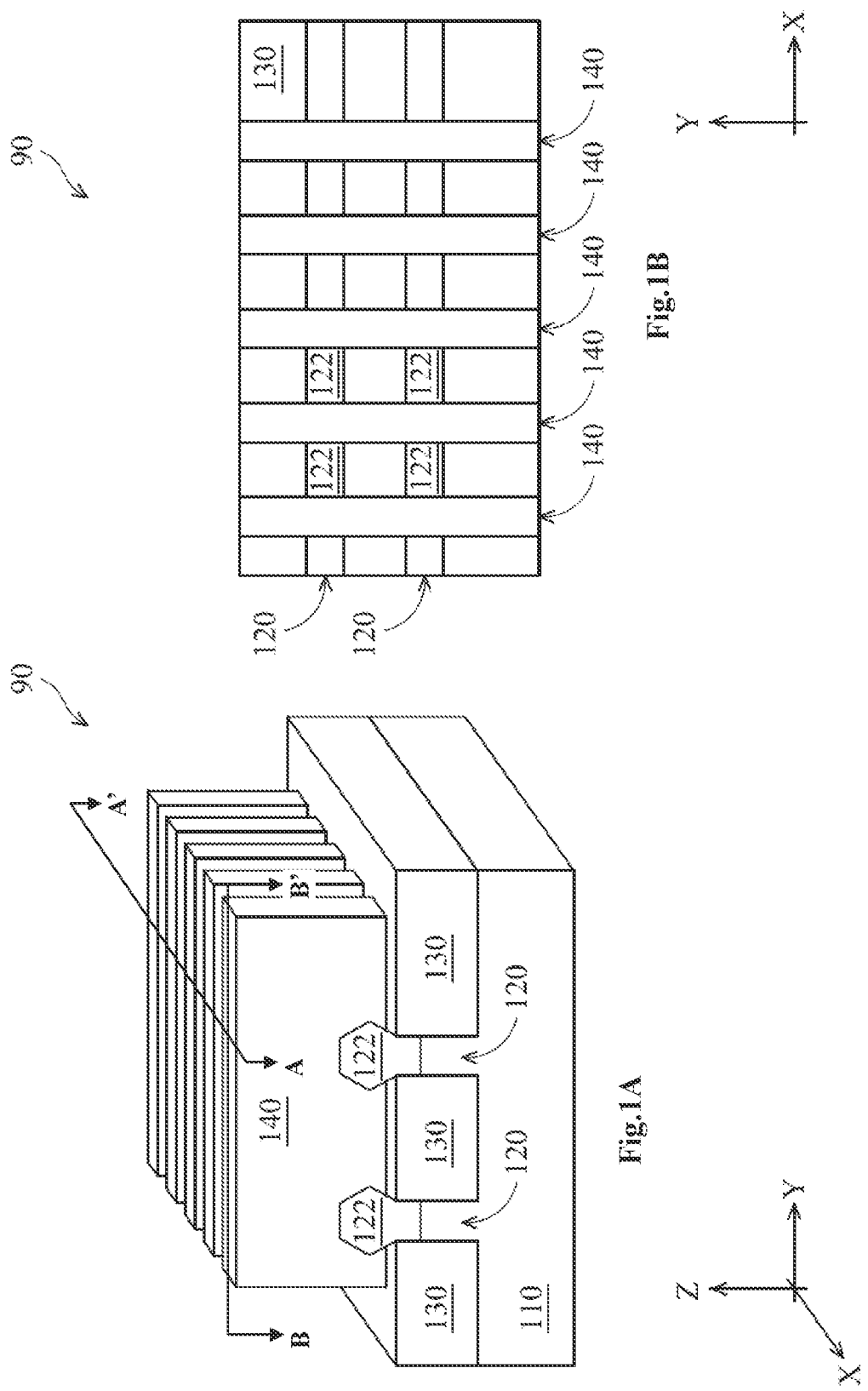

150

A'

185

185

160

155

160

140

160

A

B

B'

180

130

130

120

120

110

165

175

170

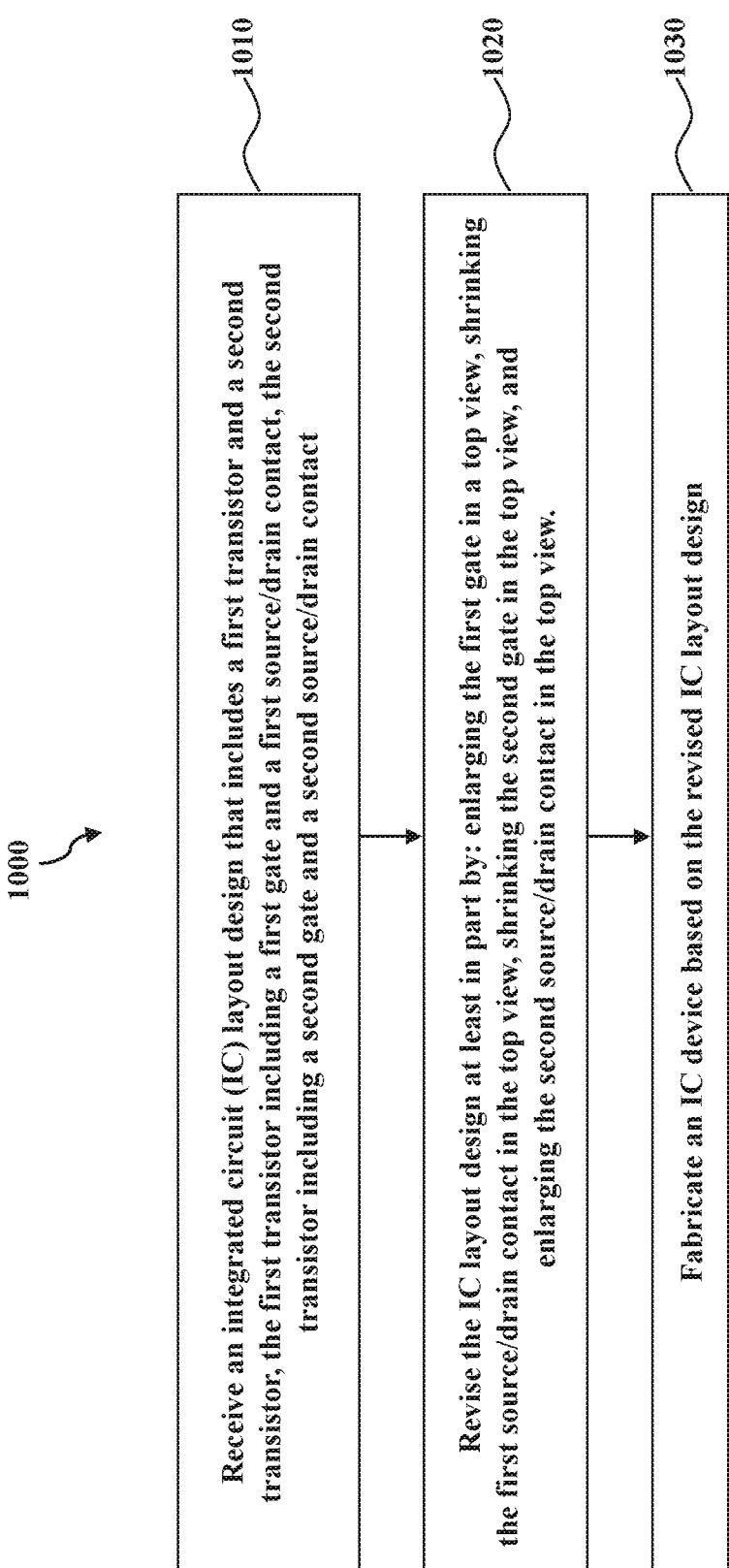

1000

1010

Receive an integrated circuit (IC) layout design that includes a first transistor and a second transistor, the first transistor including a first gate and a first source/drain contact, the second transistor including a second gate and a second source/drain contact

1020

Revise the IC layout design at least in part by: enlarging the first gate in a top view, shrinking the first source/drain contact in the top view, shrinking the second gate in the top view, and enlarging the second source/drain contact in the top view.

1030

Fabricate an IC device based on the revised IC layout design

Fig. 19

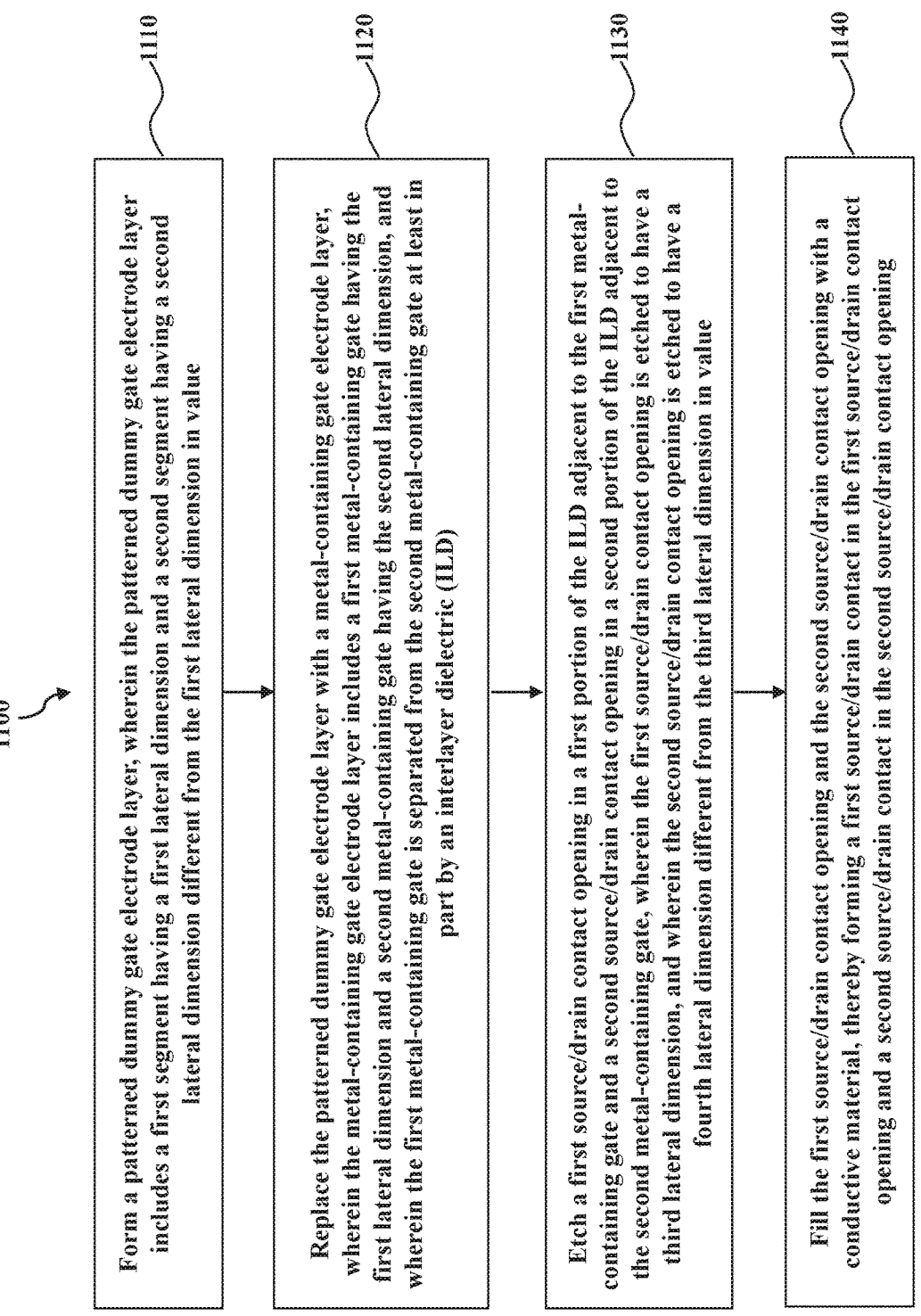

1100

1110 — Form a patterned dummy gate electrode layer, wherein the patterned dummy gate electrode layer includes a first segment having a first lateral dimension and a second segment having a second lateral dimension different from the first lateral dimension in value 1120 — Replace the patterned dummy gate electrode layer with a metal-containing gate electrode layer, wherein the metal-containing gate electrode layer includes a first metal-containing gate having the first lateral dimension and a second metal-containing gate having the second lateral dimension, and wherein the first metal-containing gate is separated from the second metal-containing gate at least in part by an interlayer dielectric (ILD)

1130 — Etch a first source/drain contact opening in a first portion of the ILD adjacent to the first metal-containing gate and a second source/drain contact opening in a second portion of the ILD adjacent to the second metal-containing gate, wherein the first source/drain contact opening is etched to have a third lateral dimension, and wherein the second source/drain contact opening is etched to have a fourth lateral dimension different from the third lateral dimension in value 1140 — Fill the first source/drain contact opening and the second source/drain contact opening with a conductive material, thereby forming a first source/drain contact in the first source/drain contact opening and a second source/drain contact in the second source/drain contact opening

Fig. 20

PERFORMANCE OPTIMIZATION BY SIZING GATES AND SOURCE/DRAIN CONTACTS DIFFERENTLY FOR DIFFERENT TRANSISTORS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as semiconductor devices continue to get scaled down, the space between the gate and source/drain contact becomes smaller, which could lead to inadvertent electrical shorting between the gate and source/drain contact. As another example, the scaling down of semiconductor devices may cause electrical current leakage. As a further example, the scaling down of semiconductor devices may increase parasitic resistance. These issues are undesirable, since they may degrade device performance or even cause device failures. Unfortunately, conventional devices and their method of fabrication have not optimized the transistors to sufficiently address these issues.

Therefore, although conventional methods of fabricating semiconductor devices have generally been adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is a perspective view of an IC device in the form of a FinFET according to various aspects of the present disclosure.

FIG. 1B is a planar top view of an IC device in the form of a FinFET according to various aspects of the present disclosure.

FIGS. 3A-16A are X-cut cross-sectional side views of various embodiments of IC devices at various stages of fabrication according to various aspects of the present disclosure.

FIGS. 3B-10B are Y-cut cross-sectional side views of various embodiments of IC devices at various stages of fabrication according to various aspects of the present disclosure.

FIG. 19 is a flowchart illustrating a method of revising an IC layout design according to various aspects of the present disclosure.

FIG. 20 is a flowchart illustrating a method of fabricating a semiconductor device according to various aspects of the present disclosure.

DETAILED DESCRIPTION

Figure 1C:
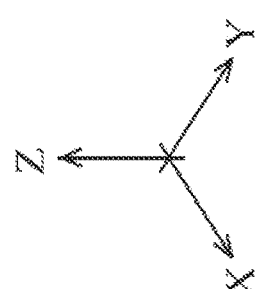
FIG. 1C is a perspective view of an IC device in the form of a GAA device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as three-dimensional fin-shaped FETs (FinFETs) or gate-all-around (GAA) devices. In that regard, a FinFET device is a fin-like field-effect transistor device, and a GAA device is a multi-channel field-effect transistor device. FinFET devices and GAA devices have both been gaining popularity recently in the semiconductor industry, since they offer several advantages over traditional Metal-Oxide Semiconductor Field Effect Transistor (MOSFET) devices (e.g., "planar" transistor devices). These advantages may include better chip area efficiency, improved carrier mobility, and fabrication processing that is compatible with the fabrication processing of planar devices. Thus, it may be desirable to design an integrated circuit (IC) chip using FinFET devices or GAA devices for a portion of, or the entire IC chip.

However, in spite of the advantages offered by the FinFET devices and/or GAA devices, certain challenges may still remain in IC applications in which FinFET or GAA devices are implemented. For example, conventional semiconductor fabrication does not take into account that transistors in different applications may have specific concerns and should be optimized differently based on their specific concerns. For example, leakage current and/or gate mismatch may be a greater concern for transistors in memory devices such as static random access memory (SRAM) cells, but parasitic resistance and/or drain saturation current may be a greater concern for transistors in non-memory devices such as logic devices. Unfortunately, conventional fabrication usually treats these transistors the same, for example, by sizing them the same, regardless of the specific application in which they are implemented. As a result, device performance has not been optimized.

Figures 2A, 2B:
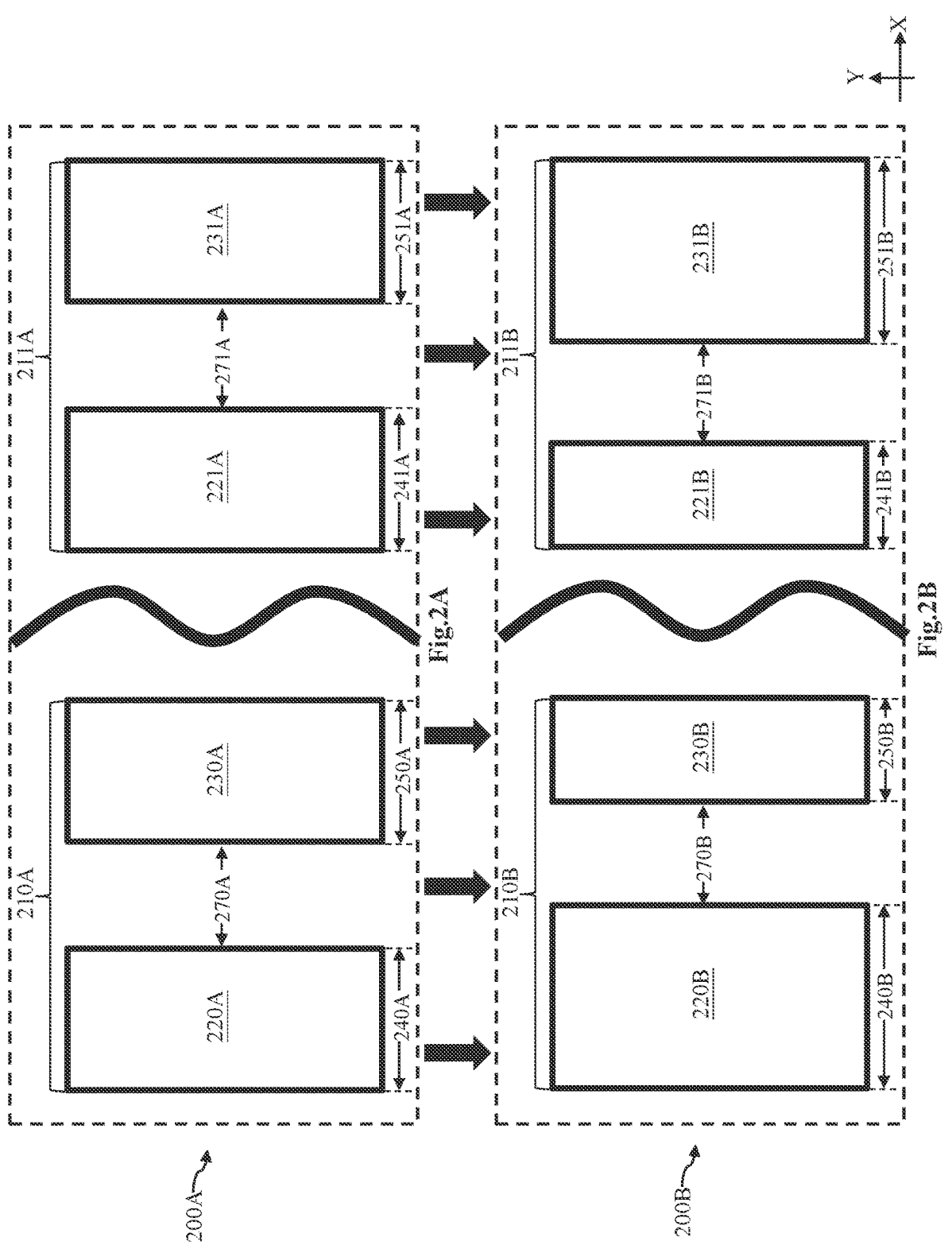
FIGS. 2A-2B illustrate an original IC layout design and a revised IC layout design, respectively, according to various aspects of the present disclosure.

To address the issues discussed above, the present disclosure configures the sizes of the gate structures and source/drain contacts differently for transistors based on the type of IC application in which they are implemented. For example, since the leakage current and/or gate mismatch is a greater concern for memory devices, the present disclosure may enlarge the gate structures for transistors of memory device to reduce the leakage current and/or gate mismatch. Meanwhile, since the parasitic resistance and/or drain saturation current is a greater concern for non-memory devices, the present disclosure may enlarge the source/drain contacts for transistors of non-memory devices to reduce the parasitic resistance and/or to increase the drain saturation current. As such, even though the memory devices and the non-memory devices are formed by the same set of fabrication processes on the same wafer, their performances may be individually optimized to address their unique concerns. It is also understood that the different sizing configurations may also apply to transistors in different density regions, or having different speeds, even if the different transistors belong to the same device application, as will be discussed in greater detail below. In more detail, FIGS. 1A-1C will describe the basic structures of example FinFET and GAA devices. FIGS. 2A-2B illustrate an original IC layout design and a revised IC layout design, respectively. FIGS. 3A-16A and 3B-10B illustrate X-cut cross-sectional side views and Y-cut cross-sectional side views, respectively, of a semiconductor device at various stages of fabrication.

Referring now to FIGS. 1A and 1B, a three-dimensional perspective view and a top view of a portion of an Integrated Circuit (IC) device 90 are illustrated, respectively. The IC device 90 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, although the IC device 90 as illustrated is a three-dimensional FinFET device, the concepts of the present disclosure may also apply to planar FET devices or GAA devices.

Referring to FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fin structures 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fin structures 120. The source/drain features 122 may include epi-layers that are epitaxially grown on the fin structures 120. The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIG. 1B, multiple fin structures 120 are oriented lengthwise along the X-direction, and multiple gate structures 140 are oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

It is also understood that the various aspects of the present disclosure discussed below may apply to multi-channel devices such as Gate-All-Around (GAA) devices. FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 is disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180.

Regardless of whether the transistors of an IC are implemented as a FinFET of FIGS. 1A-1B or a GAA device of FIG. 1C, it is understood that they may benefit from the concepts of the present disclosure, for example, by sizing the gates and source/drain contacts of different transistors differently, as discussed below in more detail.

FIGS. 2A and 2B illustrate diagrammatic fragmentary planar top views of an original IC layout design 200A and a revised IC layout design 200B, respectively. In more detail, the original IC layout design 200A may be an IC layout design received from (or provided by) an entity, for example, an IC design house. The original IC layout design 200A may include a computer file, for example, a computer file in the format of a Graphic Data System (GDS) file, which includes solder masks, geometry, layers, component labels, and the general layout of an integrated circuit. The GDS file may have a binary format in some embodiments.

In the simplified example shown in FIG. 2A, the original IC layout design 200A includes at least two different transistors: a transistor 210A and a transistor 211A, which may be configured to be fabricated on a same wafer using a same set of fabrication processes. According to the various aspects of the present disclosure, the transistors 210A and 211A are transistors that have different concerns, and thus they should be optimized differently from each other, as will be discussed in more detail below. In some embodiments, the transistor 210A is a transistor from a memory device, for example, a static random access memory (SRAM) cell. Meanwhile, the transistor 211A is a transistor from a non-memory device, for example, a logic device. In some embodiments, a logic device may include microcontrollers or other circuits that interface or operate the SRAM cells, including but not limited to: "read" or "write" driver circuits, sense amplifier circuits, row/column decoders, shifter registers, address generators, and circuits that produce various control signals. In some other embodiments, the transistors 210A and the transistor 211A may be from the same type of IC applications. For example, the transistor 210A may be a transistor located in a higher density region, whereas the transistor 211A may be a transistor located in a lower density region. As another example, the transistor 210A may be a transistor having a lower speed, whereas the transistor 211A may be a transistor having a greater speed.

As shown in FIG. 2A, the transistor 210A includes at least a gate structure 220A and a source/drain contact 230A, and the transistor 211A includes at least a gate structure 221A and a source/drain contact 231A. Of course, the transistors 210A and 211A may include other components, such as source/drain regions, channel regions, gate contacts, etc. However, these additional components are not illustrated herein for reasons of simplicity. In FIG. 2A, the gate structures 220A and 221A and the source/drain contacts 230A and 231A each extend in the Y-direction in the top view, and they are spaced apart from one another in the X-direction in the top view. According to the original IC layout design 200A, the gate structures 220A and 221A may have dimensions 240A and 241A, respectively, and the source/drain contacts 230A and 231A may have dimensions 250A and 251A, respectively, where the dimensions 240A-241A and 250A-251A are each measured in the X-direction. In some embodiments, the dimensions 240A and 241A may be substantially similar to each other in value, and the dimensions 250A and 251A may be substantially similar to each other in value, since these dimensions 240A-241A and 250A-251A have not been optimized yet. In other words, the dimensions 240A-241A may be initially configured (e.g., by an IC design entity) to be substantially the same for reasons of simplicity, and the same may be true for the dimensions 250A-251A.

According to various aspects of the present disclosure, the original IC layout design 200A is revised to generate a revised IC layout design 200B, so as to optimize the transistors 210A and 211A differently based on their different concerns. For example, the layout of the transistor 210A is revised by enlarging the gate structure 220A in the X-direction while shrinking the source/drain contact 230A in the X-direction. As a result, the revised IC layout design 200B now includes a transistor 210B (having a revised layout) that contains an enlarged gate structure 220B and a shrunken source/drain contact 230B. Meanwhile, the layout of the transistor 211A is revised by shrinking the gate structure 221A in the X-direction while enlarging the source/drain contact 231A in the X-direction. As a result, the revised IC layout design 200B also includes a transistor 211B (having a revised layout) that contains a shrunken gate structure 221B and an enlarged source/drain contact 231B.

As discussed above, the transistor 210A may be a part of a circuit where leakage current and/or mismatch with the gate structures of the other transistors of the circuit are more important concerns. In that regard, leakage current may arise due to a short channel effect (SCE). In other words, as the dimension 240A of the gate structure 220A shrinks in each new technology node with smaller geometries, the corresponding channel shrinks as well, which increases the potential leakage current. Here, by enlarging the gate structure 220A into the gate structure 220B, the corresponding channel is enlarged, which reduces the potential leakage current, since the short channel effect is not as pronounced with the larger channel (due to the enlarged gate structure 220B).

In addition, the mismatch between the gate structure 220A and other similar gate structures may improve as the gate structure 220A is enlarged. For example, the gate structure 220A may be a part of an SRAM cell that includes a plurality of other transistors that each have a corresponding gate structure. For the SRAM cell to function properly, it may be desirable for all of the transistors to have substantially similar gate dimensions, since gate dimension mismatches may lead to asymmetry or imbalances between the electrical performance of these transistors in the SRAM cell. Unfortunately, as semiconductor device sizes get scaled down with each newer technology node, it may be even more difficult to control the dimensions of all of the gate structures in an SRAM cell with precision. Furthermore, as the gate structures become smaller, even a slight mismatch may lead to adverse effects, since a mismatch now accounts for a larger percentage of the overall size of the gate. As a result, devices fabricated under advanced technology nodes may be more susceptible to undesirable gate dimension mismatches, which could also degrade device performance.

Here, by enlarging the gate structure 220A of the original IC layout design 200A to generate the gate structure 220B of the revised IC layout design 200B, it is easier to control the sizes of the gate structure 220B and other similar gate structures of the SRAM cell more precisely. Furthermore, any potential gate dimension mismatch between the gate structure 220B and other similar gate structures of the SRAM cell constitutes a smaller percentage of the overall size of the now enlarged gate structure 220B. Therefore, potential gate dimension mismatches are also reduced (as an overall percentage value), and their harmful effects are minimized as well.

It is understood that transistors in higher pattern density regions of a wafer may also be more prone to leakage current from the short channel effect, and/or the gate dimension mismatches. Therefore, the benefits associated with enlarging of the gate structure 220A into the gate structure 220B may also apply to embodiments when the transistor 210A is located in a higher pattern density region of the wafer.

Note that the enlargement of the gate structure (from the original gate structure 220A into the revised gate structure 220B) may be accompanied by a shrinking of the source/drain contact (from the original source/drain contact 230A into the revised source/drain contact 230B). This is done at least partially to ensure that a distance 270B separating the gate structure 220B and the source/drain contact 230B in the revised IC layout design 200B is still sufficiently big to avoid electrical shorting between the gate structure 220B and the source/drain contact 230B, while not too big to occupy precious chip space unnecessarily. In some embodiments, the distance 270B of the revised IC layout design 200B may be substantially equal to the distance 270A of the original IC layout design 200A. Of course, the shrinking of the source/drain contact 230A into the source/drain contact 230B may increase parasitic resistance of the source/drain contact, but that is a less important concern than the leakage current and gate dimension mismatch in the case of the transistor 210A. As such, such a tradeoff is still beneficial to the optimization of the transistor 210A.

However, in the case of the transistor 211A, leakage current and/or gate dimension mismatch are not as important concerns as parasitic resistance of the source/drain contact. This is because the transistor 211A may be used to implement logic devices or other higher speed applications where speed is more important. The speed of a transistor is inversely correlated to its parasitic resistance, and thus it is more beneficial for the transistor 211A to have a reduced source/drain contact resistance. As such, the present disclosure optimizes the performance of the transistor 211A by revising its layout to enlarge the source/drain contact 231A to generate the source/drain contact 231B and to shrink the gate structure 221A to generate the gate structure 221B. Enlarging the source/drain contact 231A also helps to improve a drain saturation current (referred to as Id sat), which is normalized with respect to a threshold voltage (referred to as V t). The drain saturation current normalized against the threshold voltage may be expressed as a percentage, which may be referred to as an $I_{on}\%$. The $I_{on}\%$—which may be another important concern for the transistor 211A—may also be improved by the reduction in the parasitic resistance of the source/drain contact.

Note that the enlargement of the source/drain contact (from the original source/drain contact 231A into the revised source/drain contact 231B) may be accompanied by a shrinking of the gate structure (from the original gate structure 221A into the revised gate structure 221B). This is so that a distance 271B separating the gate structure 221B and the source/drain contact 231B in the revised IC layout design 200B is still sufficiently big to avoid electrical shorting between the gate structure 221B and the source/drain contact 231B, while not too big to occupy precious chip space unnecessarily. In some embodiments, the distance 271B of the revised IC layout design 200B may be substantially equal to the distance 271A of the original IC layout design 200A. Of course, the shrinking of the gate structure 221A into the gate structure 221B may increase leakage current and/or gate dimension mismatch, but they are less important concerns than the source/drain contact parasitic resistance or the drain saturation current in the case of the transistor 211A. As such, such a tradeoff is still beneficial to the optimization of the transistor 211A.

As shown in FIG. 2B, the enlarged gate structure 220B now has a dimension 240B measured in the X-direction, the shrunken source/drain contact 230B now has a dimension 250B measured in the X-direction, the shrunken gate structure 221B now has a dimension 241B measured in the X-direction, and the enlarged source/drain contact 231B now has a dimension 251B measured in the X-direction. Compared to the transistors 210A and 211A of the original IC layout design 200A, the dimension 240B is greater than the dimension 240A, the dimension 250B is less than the dimension 250A, the dimension 241B is less than the dimension 241A, and the dimension 251B is greater than the dimension 251A.

The size revisions from the original IC layout design 200A to the revised IC layout design 200B may also be expressed in terms of ratios. For example, according to the original IC layout design 200A, the dimension 240A and the dimension 250A defines a first ratio. After the original IC layout design 200A has been revised into the revised IC layout design 200B, the dimension 240B and the dimension 250B defines a second ratio. Since the dimension 240B is greater than the dimension 240A, and since the dimension 250B is less than the dimension 250A, the second ratio is greater than the first ratio. Similarly, according to the original IC layout design 200A, the dimension 241A and the dimension 251A defines a third ratio. After the original IC layout design 200A has been revised into the revised IC layout design 200B, the dimension 241B and the dimension 251B defines a fourth ratio. Since the dimension 241B is smaller than the dimension 241A, and since the dimension 251B is greater than the dimension 251A, the third ratio is greater than the fourth ratio.

In some embodiments, the first ratio is in a range between about 1.07:1 and about 1.15:1, the second ratio is greater than the first ratio and is in a range between about 1.11:1 and about 1.27:1, the third ratio is in a range between about 1.07:1 and about 1.15:1, and the fourth ratio is less than the third ratio and is in a range between about 1:1 and about 1.14:1. The above ranges are not randomly chosen but specifically configured to optimize device performance. For example, if the second ratio (defined by the dimension 240B and the dimension 250B) is too small, that would mean that the gate structure has not been enlarged enough to derive the benefits associated with the reduction of leakage current and gate dimension mismatches. On the other hand, if the second ratio is too big, that would mean that the gate structure 220B has been enlarged beyond the point of diminishing returns at the expense of excessive parasitic resistance. In other words, although leakage current and gate dimension mismatch can be substantially reduced, the parasitic resistance of the source/drain contact 230B may be too high, such that the performance of the transistor 210B is no longer optimized.

Similarly, if the fourth ratio (defined by the dimension 241B and the dimension 251B) is too big, that would mean that the source/drain contact 231B has not been enlarged enough to derive the benefits associated with the reduction of parasitic source/drain resistance or the improvement in drain saturation current. On the other hand, if the fourth ratio is too small, that would mean that the source/drain contact 231B has been enlarged beyond the point of diminishing returns at the expense of excessive leakage current and/or gate dimension mismatches. In other words, although parasitic capacitance can be substantially reduced and drain saturation current can be substantially increased, the leakage current and gate dimension mismatch may become too high, such that the performance of the transistor 211B is no longer optimized.

It is noted that the general process flow described herein need not set the target of the gate structure and the source/drain contact separately for logic devices and SRAM devices. After target modulation, the logic and SRAM devices can be optimized under the conditions acceptable to the process.

Note also that the gate structure 220A and the source/drain contact 230A may be spaced apart in the X-direction by a distance 270A, and the gate structure 221A and the source/drain contact 231A may be spaced apart in the X-direction by a distance 271A. The distance 270A and the distance 271A may be configured to be sufficiently big to avoid electrical bridging risks (e.g., the gate structure 220A and the source/drain contact 230A electrically shorting with one another, or the gate structure 221A and the source/drain contact 231A electrically shorting with one another), but also not too big to unduly consume valuable chip real estate. In some embodiments, the revised IC layout design 200B is generated without changing these spacings. In other words, a value of the distance 270A separating the gate structure 220A and the source/drain contact 230A may be substantially equal to a value of the distance 270B separating the gate structure 220B and the source/drain contact 230B. Similarly, a value of the distance 271A separating the gate structure 221A and the source/drain contact 231A may be substantially equal to a value of the distance 271B separating the gate structure 221B and the source/drain contact 231B. Maintaining the same values of the distances 270A-270B and 271A-271B helps ensure that the undesirable electrical shorting risk between the gate structures and source/drain contacts remains low in the revised IC layout design. In some embodiments, the distance 270A may be substantially equal to the distance 271A, and the distance 270B may be substantially equal to the distance 271B.

Furthermore, the revised IC layout design 200B does not change the dimensions of the gate structures 220B-221B and the source/drain contacts 230B-231B in the Y-direction. Stated differently, the revision of the original IC layout design 200A may not affect the dimensions of the gate structures and the source/drain contacts in the Y-direction very much (if at all), so that the overall size of the circuits (composed of the individually-optimized transistors) still remains substantially the same.

FIGS. 3A-16A and 3B-10B illustrate the cross-sectional side views of an IC device 300 at different stages of fabrication. FIGS. 3A-16A correspond to the cross-sectional cuts taken along an X-direction, for example along the cutline A-A' in FIG. 1A or 1C. As such, FIGS. 3A-16A may be referred to as X-cut Figures. FIGS. 3B-10B correspond to the cross-sectional cuts taken along a Y-direction, for example along the cutline B-B' in FIG. 1A or 1C. As such, FIGS. 3B-10B may be referred to as Y-cut Figures. For reasons of consistency and clarity, similar components appearing in FIGS. 1A-1C, 3A-16A, and 3B-10B will be labeled the same.

Figure 3A:
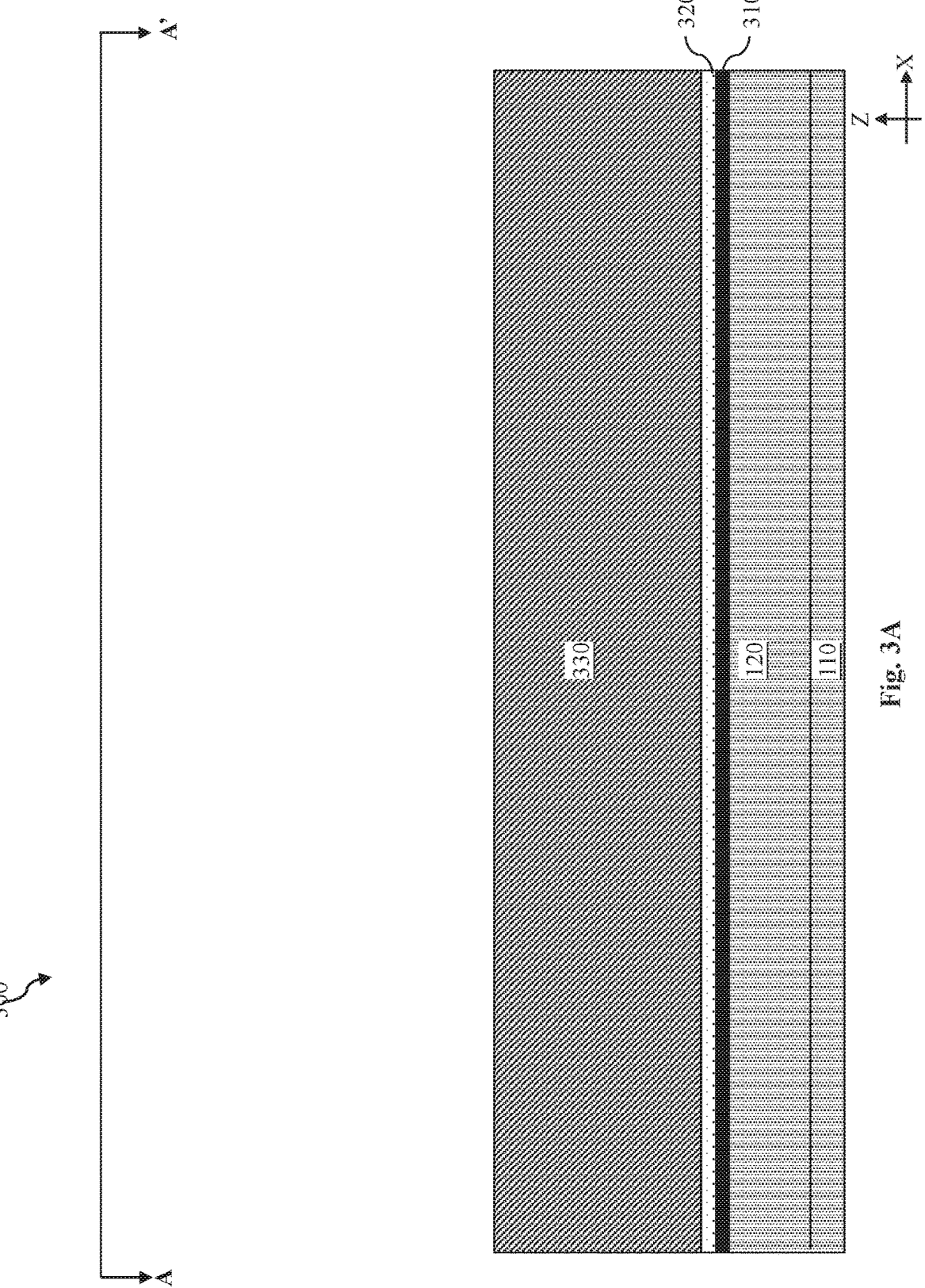
Figure 3B:
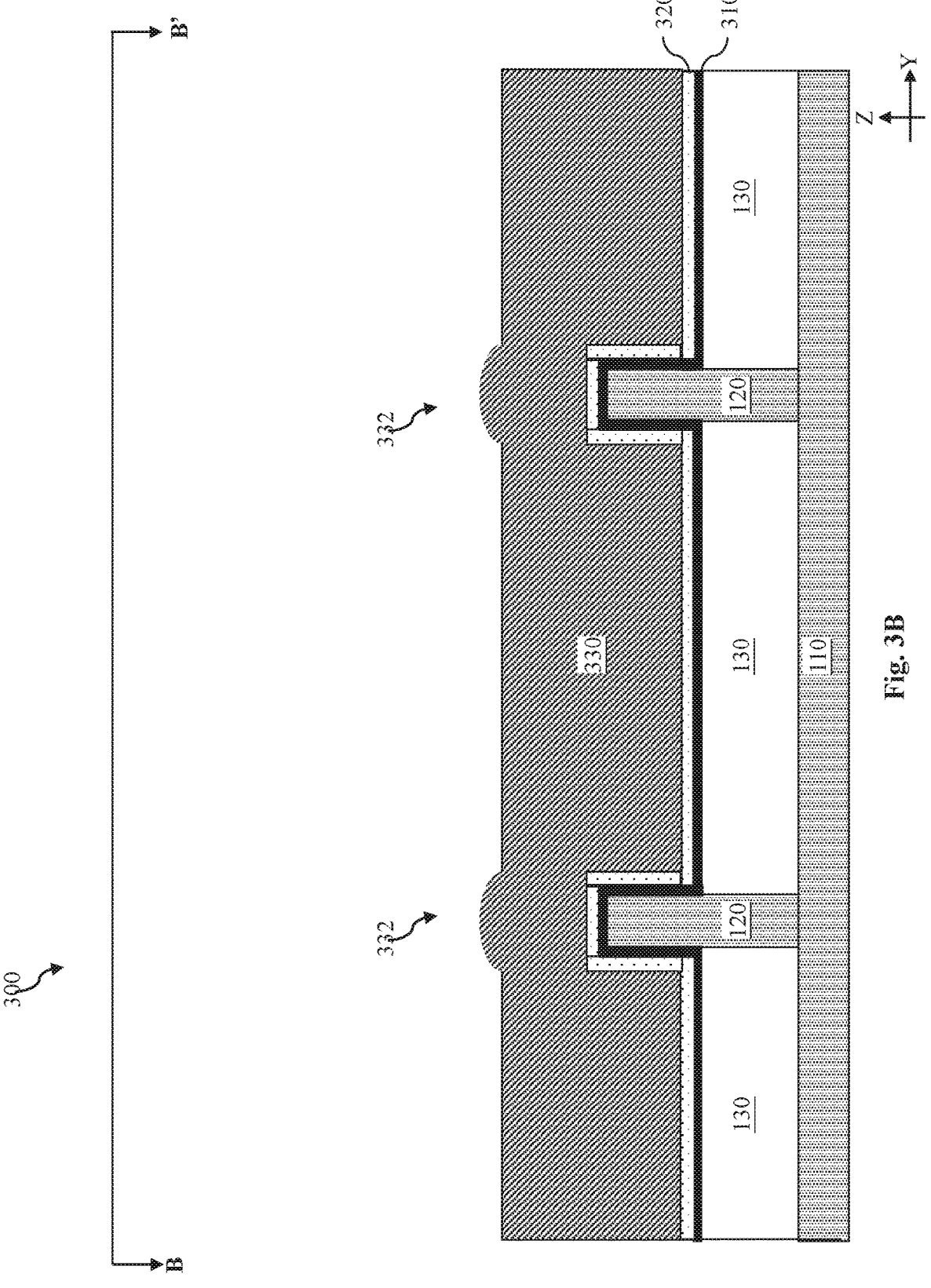

Referring to FIGS. 3A-3B, the IC device 300 includes the substrate 110 discussed above with reference to FIGS. 1A-1C, for example a silicon substrate. The substrate 110 includes a plurality of active regions, for example the fin structures 120 discussed above with reference to FIGS. 1A-1B. The fin structures 120 each extend laterally in the X-direction, and they are separated from one another in the Y-direction by the isolation structures 130. In some embodiments, the isolation structures 130 may be formed by a flowable chemical vapor deposition (FCVD) process.

A capping layer 310 is formed over the fin structures 120 and over the isolation structures 130. In some embodiments, the capping layer 310 may be formed by a deposition process, such as chemical vapor deposition (CVD), physical vapor deposition (PVD), atomic layer deposition (ALD), or a combination thereof. In some embodiments, the capping layer 310 includes silicon. As such, the capping layer 310 may also be referred to as a silicon capping layer.

A dielectric layer 320 is formed over the capping layer 310. The dielectric layer 320 may also be formed using a deposition process such as CVD, PVD, ALD, or combinations thereof. In some embodiments, the dielectric layer 320 includes silicon oxide.

A dummy gate electrode layer 330 is formed over the dielectric layer 320. The dummy gate electrode layer 330 may also be formed using a deposition process such as CVD, PVD, ALD, or combinations thereof. In some embodiments, the dummy gate electrode layer 330 includes polysilicon. Note that, due to the presence of the upwardly protruding fin structures 120 (and the capping layer 310 and the dielectric layer 320 formed on the fin structures 120), an upper surface of the dummy gate electrode layer 330 may have humps 332 (e.g., an upward protrusion), where the locations of the humps 332 correspond to the locations of the fin structures 120, as illustrated in FIG. 3B.

Figure 4A:
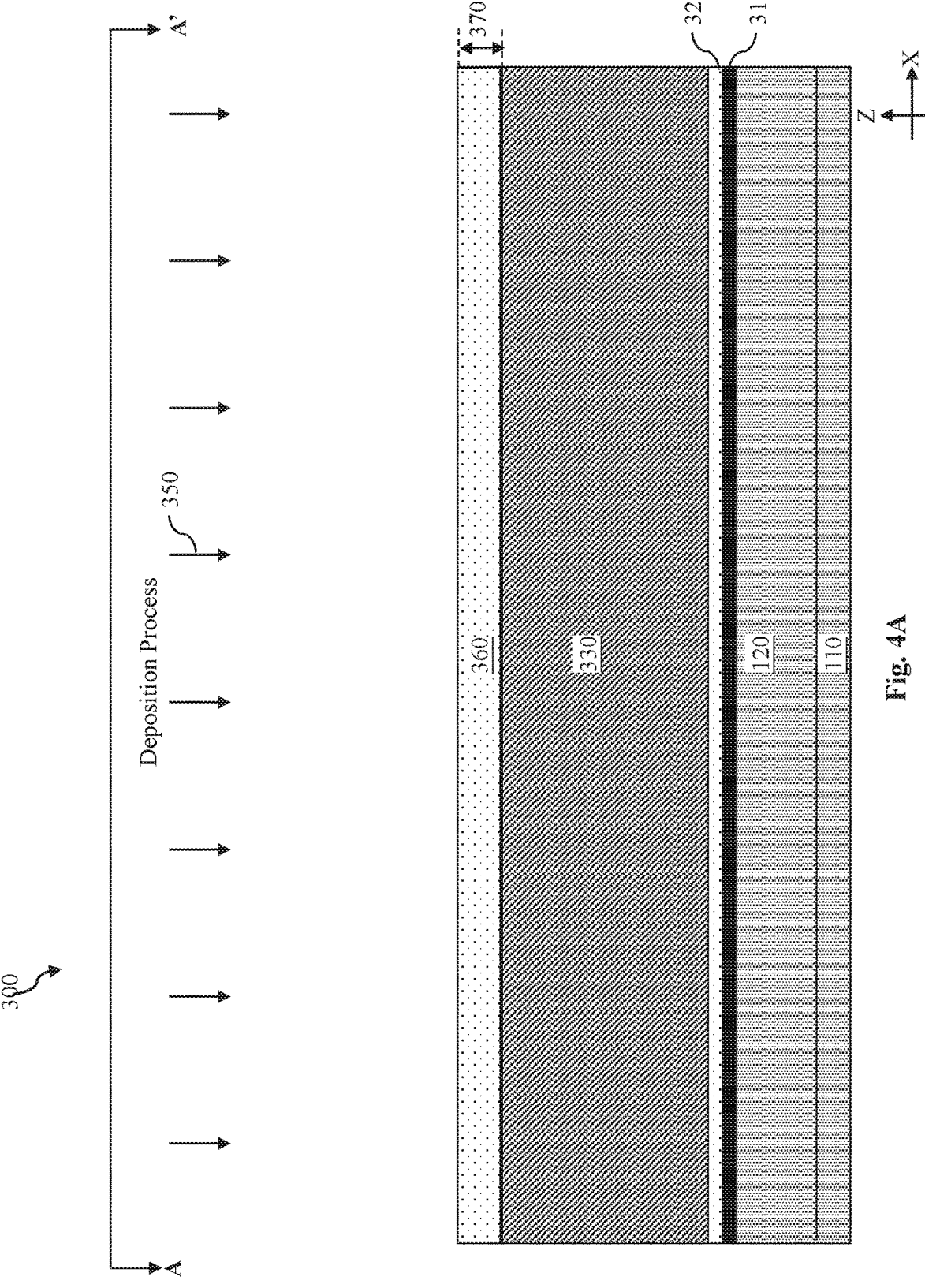
Figure 4B:
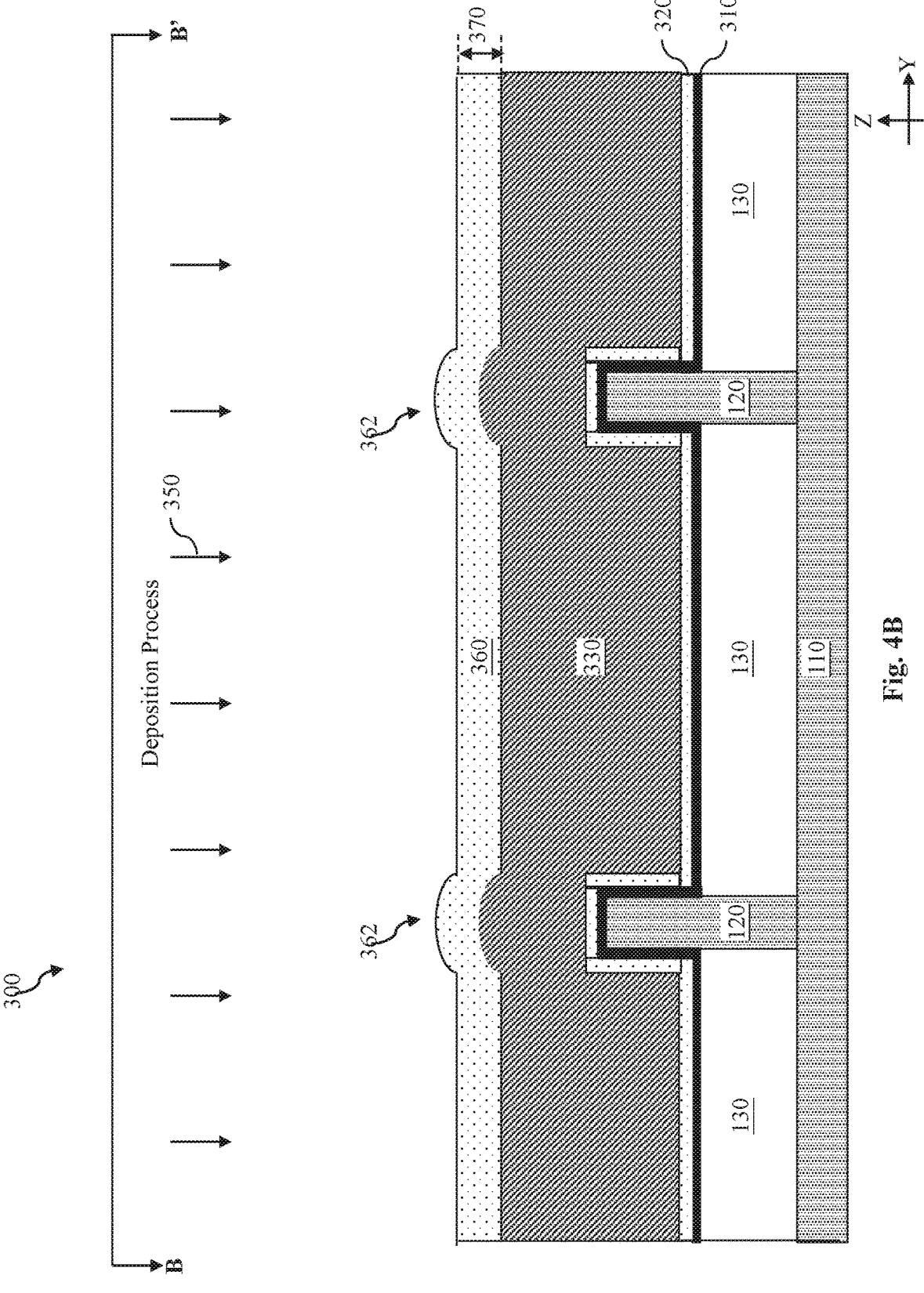

Referring now to FIGS. 4A-4B, a deposition process 350 is performed to the IC device 300 to form a dielectric layer 360 over the dummy gate electrode layer 330. In some embodiments, the deposition process 350 may include CVD, PVD, ALD, or combinations thereof. In some embodiments, the dielectric layer 360 includes silicon nitride. The deposition process 350 may be performed conformally, such that the dielectric layer 360 inherits the upper surface profile of the dummy gate electrode layer 330 below, including the humps 332. In other words, an upper surface of the dielectric layer 360 may also have humps 362, whose locations correspond to the locations of the humps 332 (see FIG. 3B) and the fin structures 120. The deposition process 350 is also performed to configure a thickness 370 of the dielectric layer 360. In some embodiments, the thickness 370 is in a range between about 50 angstroms and about 150 angstroms.

Figure 5A:
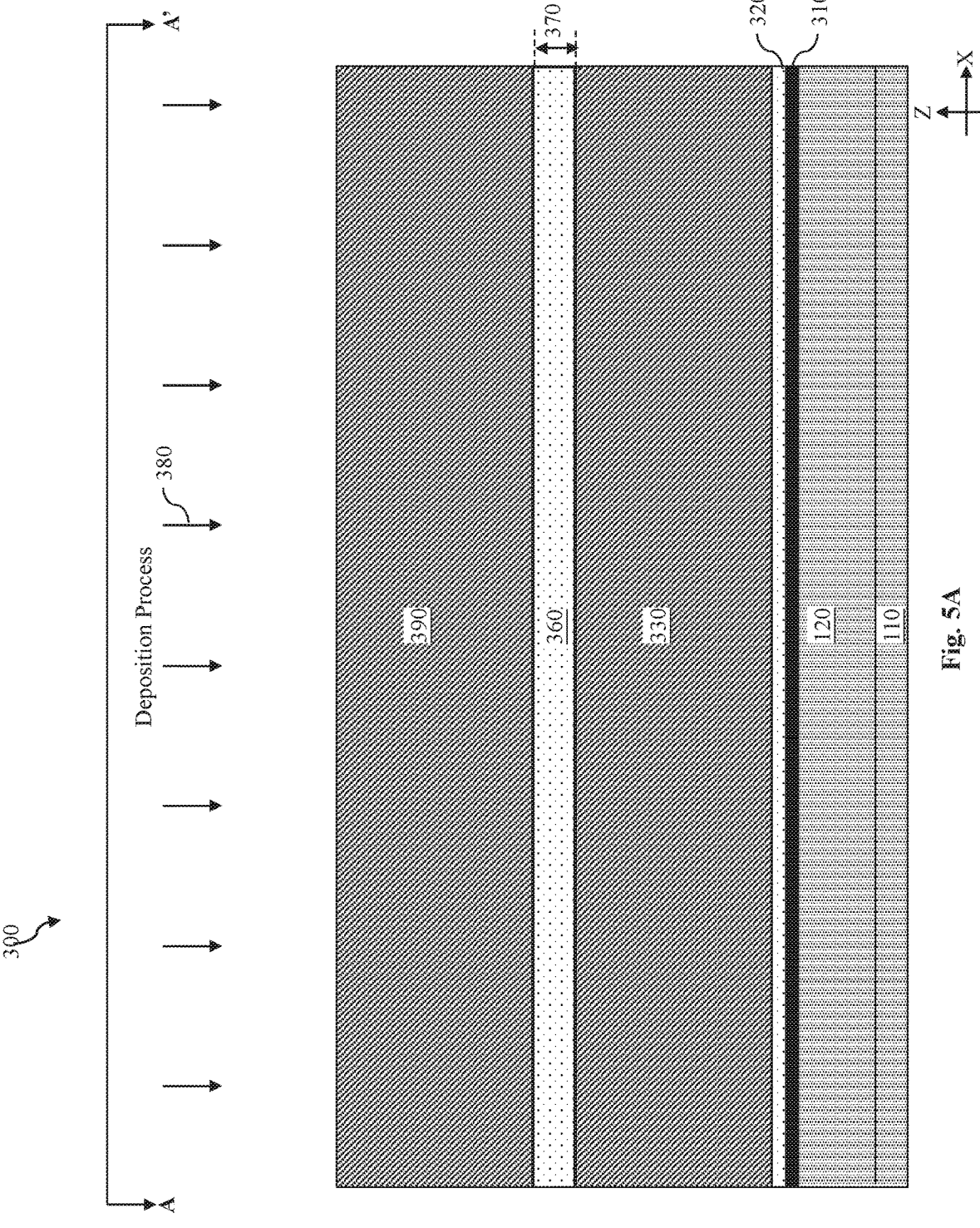
Figure 5B:
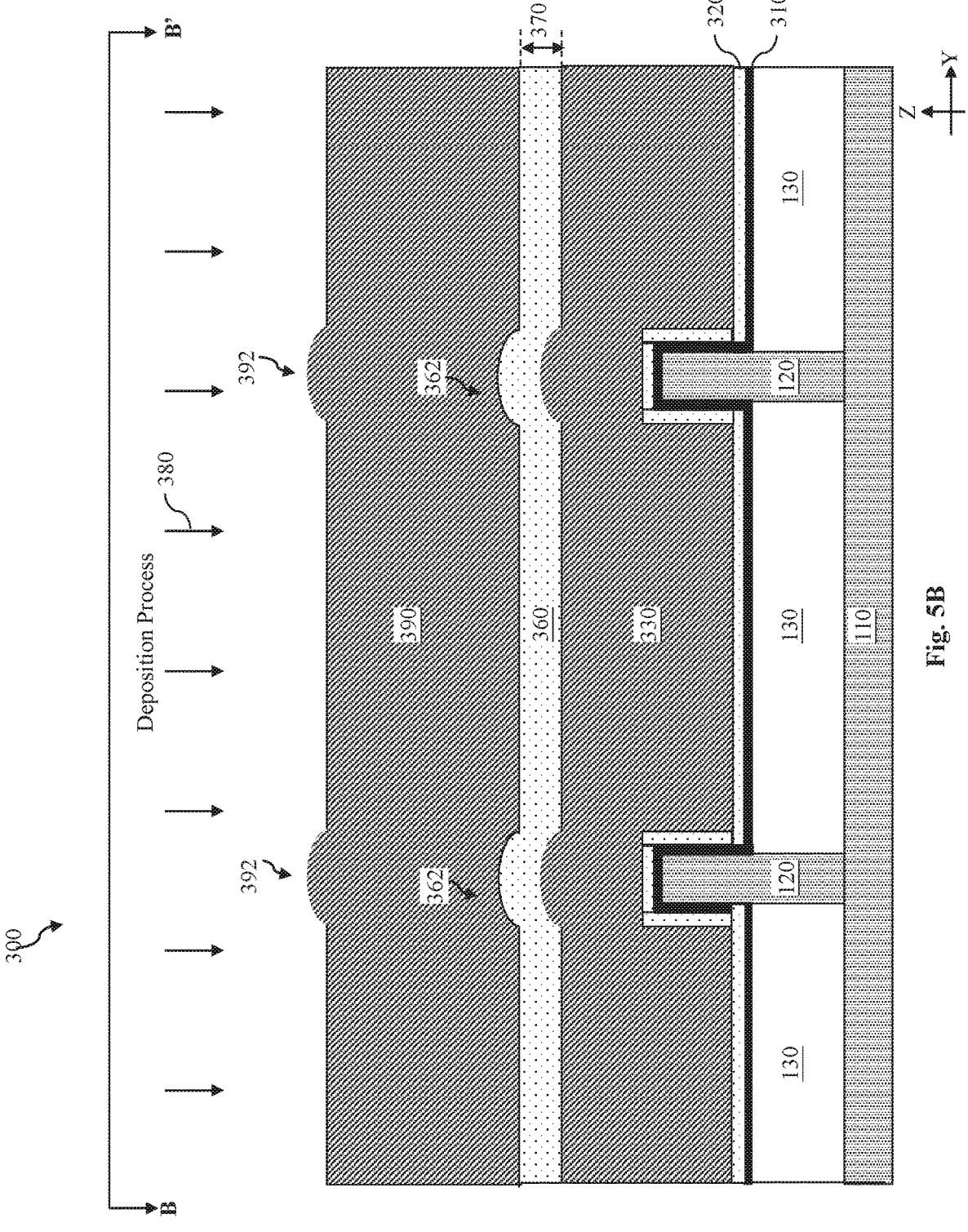

Referring now to FIGS. 5A-5B, a deposition process 380 is performed to the IC device 300 to form a dummy gate electrode layer 390. In some embodiments, the deposition process 380 may include CVD, PVD, ALD, or combinations thereof. In some embodiments, the dummy gate electrode layer 390 includes a same material as the dummy gate electrode layer 330. For example, the dummy gate electrode layer 330 and the dummy gate electrode layer 390 each include polysilicon. The deposition process 380 may be performed conformally, such that the dummy gate electrode layer 390 inherits the upper surface profile of the dielectric layer 360 below, including the humps 362. In other words, an upper surface of the dummy gate electrode layer 390 may also have humps 392, whose locations correspond to the locations of the humps 362, the humps 332 (see FIG. 3B), and the fin structures 120.

Figure 6A:
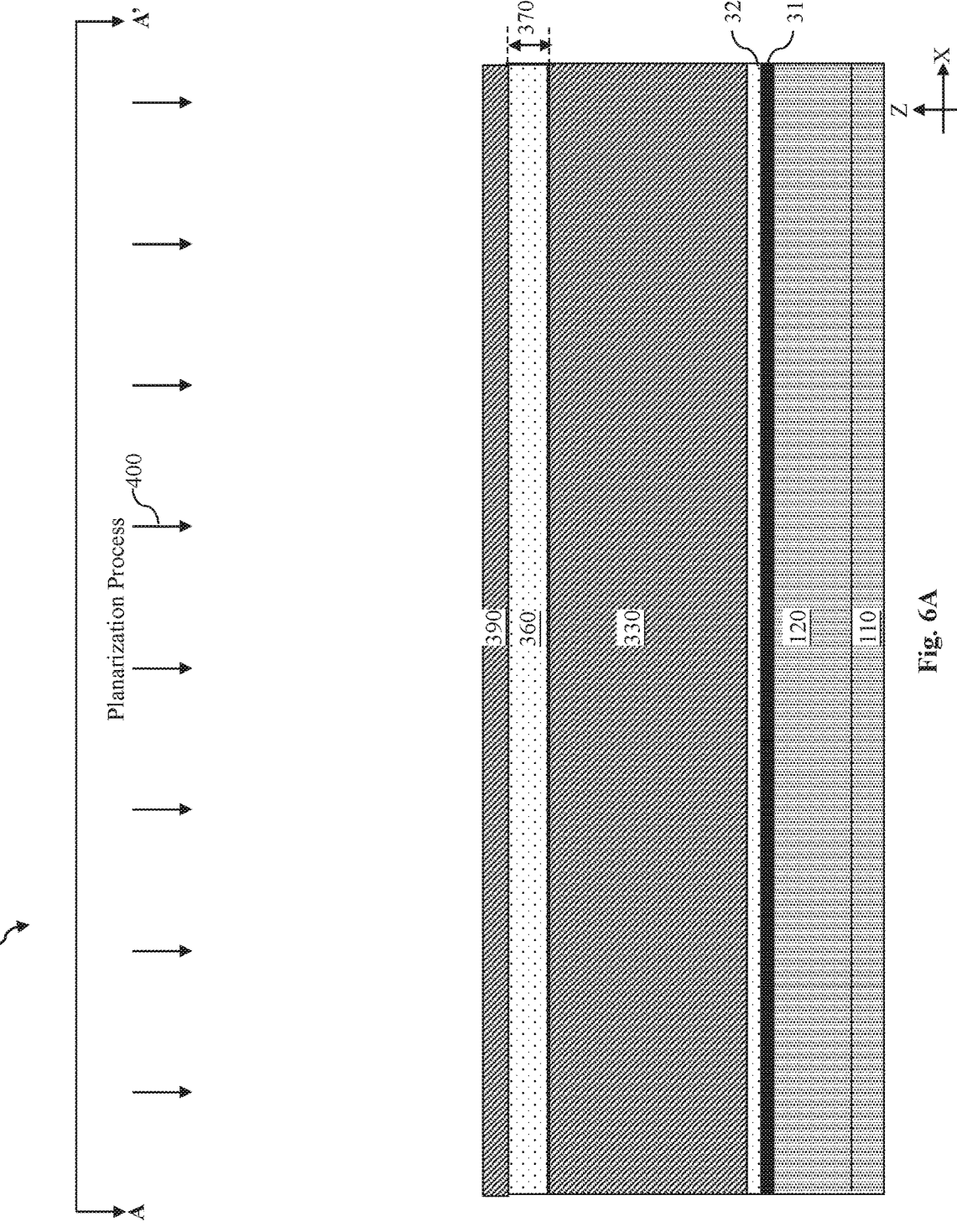
Figure 6B:
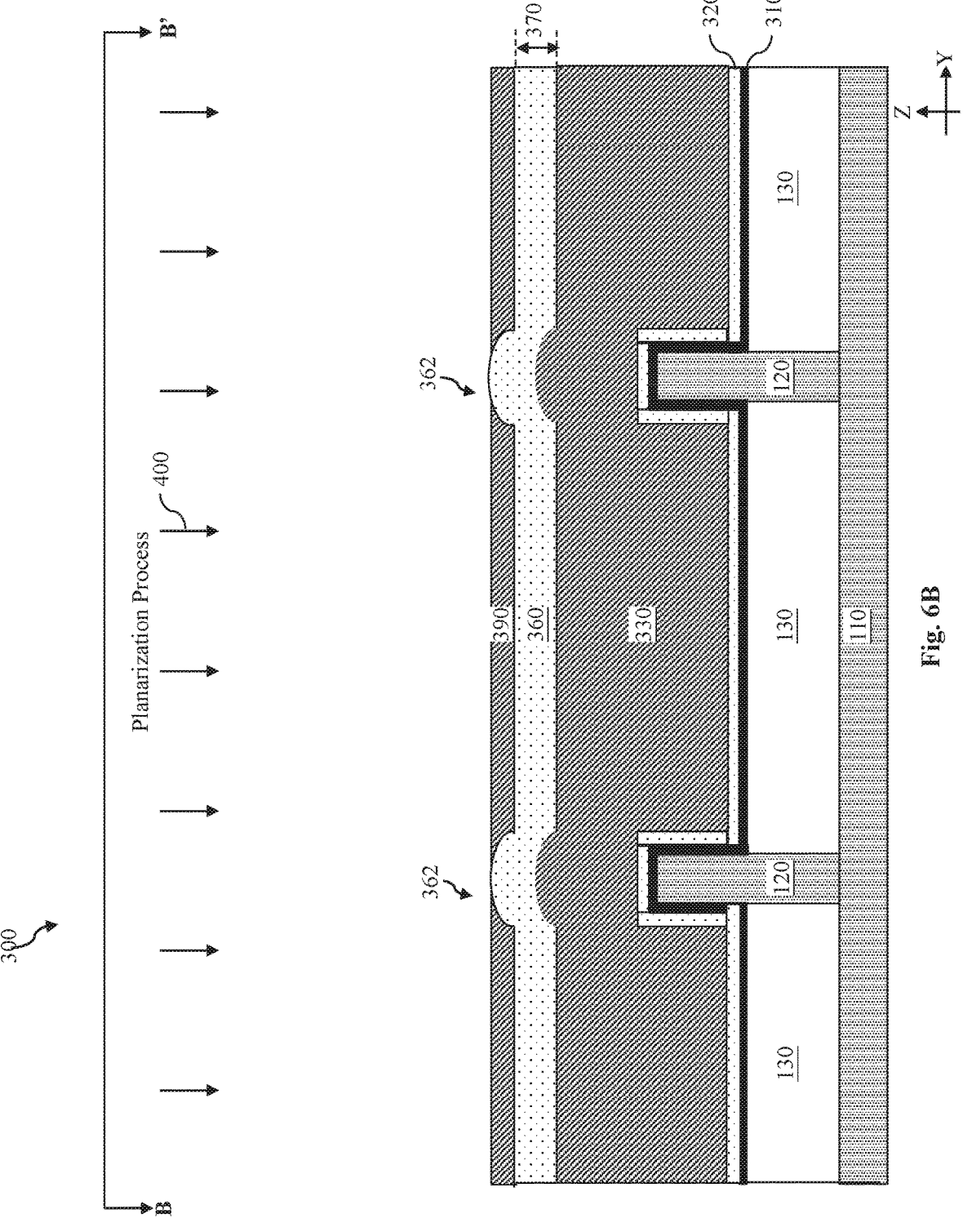

Referring now to FIGS. 6A-6B, a planarization process 400 is performed to the IC device 300 to substantially remove a majority of the dummy gate electrode layer 390. In some embodiments, the planarization process 400 includes a chemical mechanical polishing (CMP) process. The planarization process 400 is performed to remove the dummy gate electrode layer 390 until the humps 362 of the dielectric layer 360 are reached.

Figure 7A:
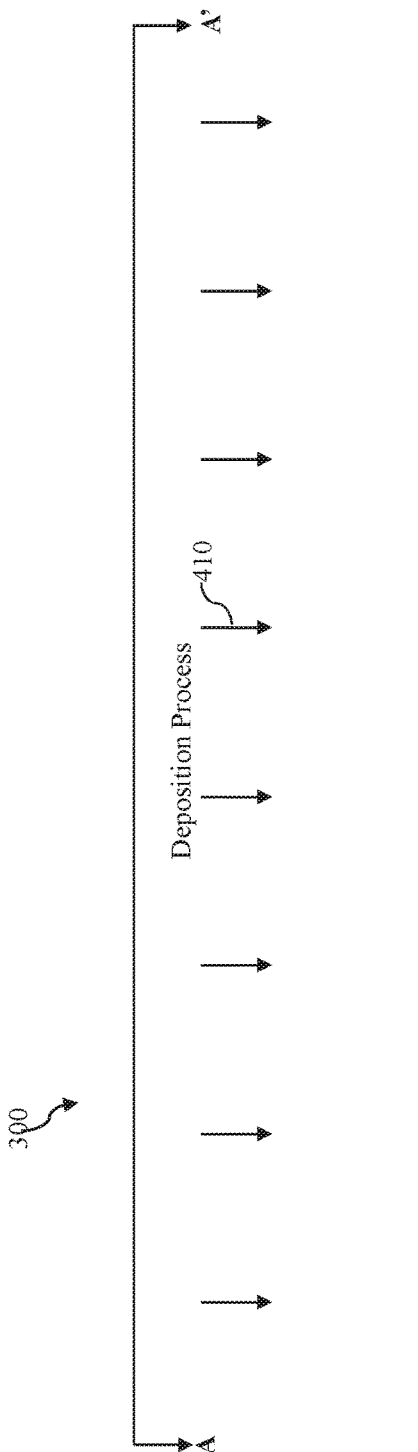
Figure 7A:
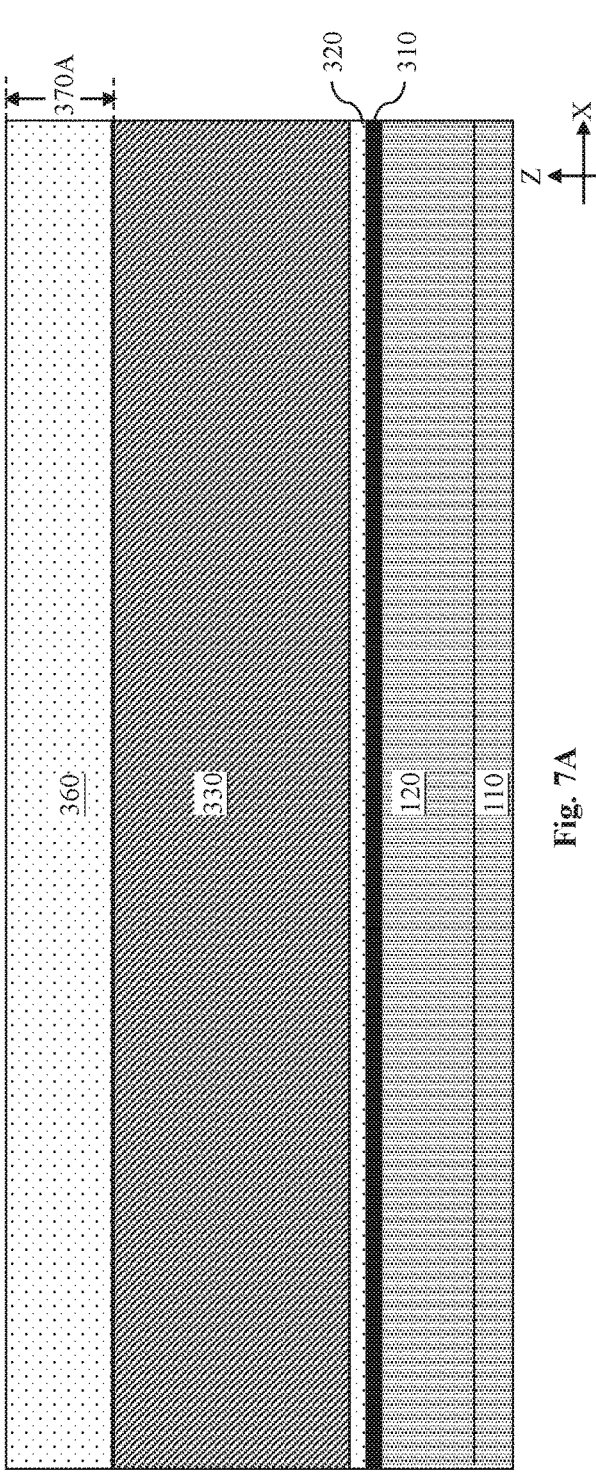
Figure 7B:
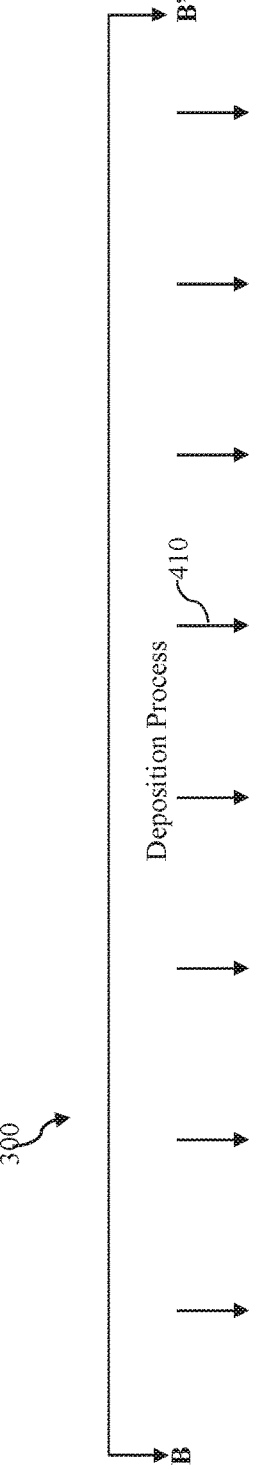
Figure 7B:
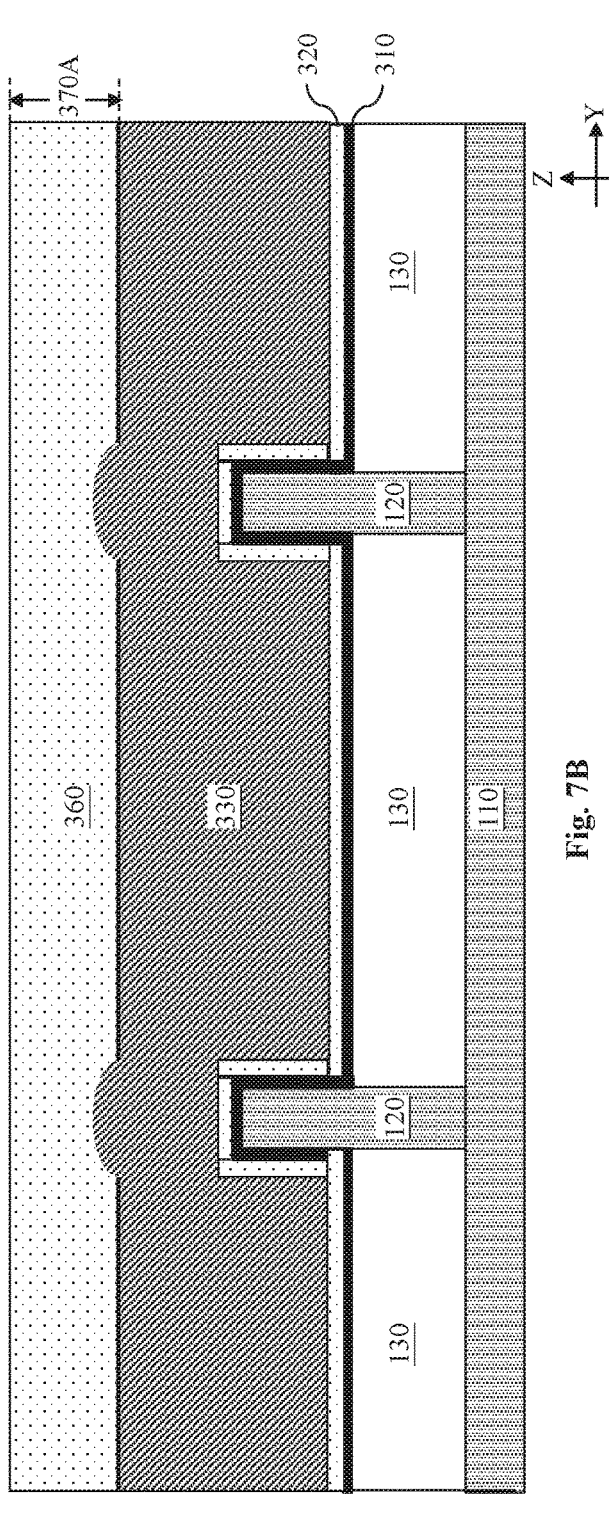

Referring now to FIGS. 7A-7B, the remaining portion of the dummy gate electrode layer 390 is removed, for example using an etching process. Thereafter, a deposition process 410 is performed to the IC device 300 to thicken the dielectric layer 360. In other words, additional materials (e.g., silicon nitride) of the dielectric layer 360 may be deposited by the deposition process 400. The thickened dielectric layer 360 now has a thickness 370A, which may be in a range between about 150 angstroms and about 250 angstroms in some embodiments.

Figure 8A:
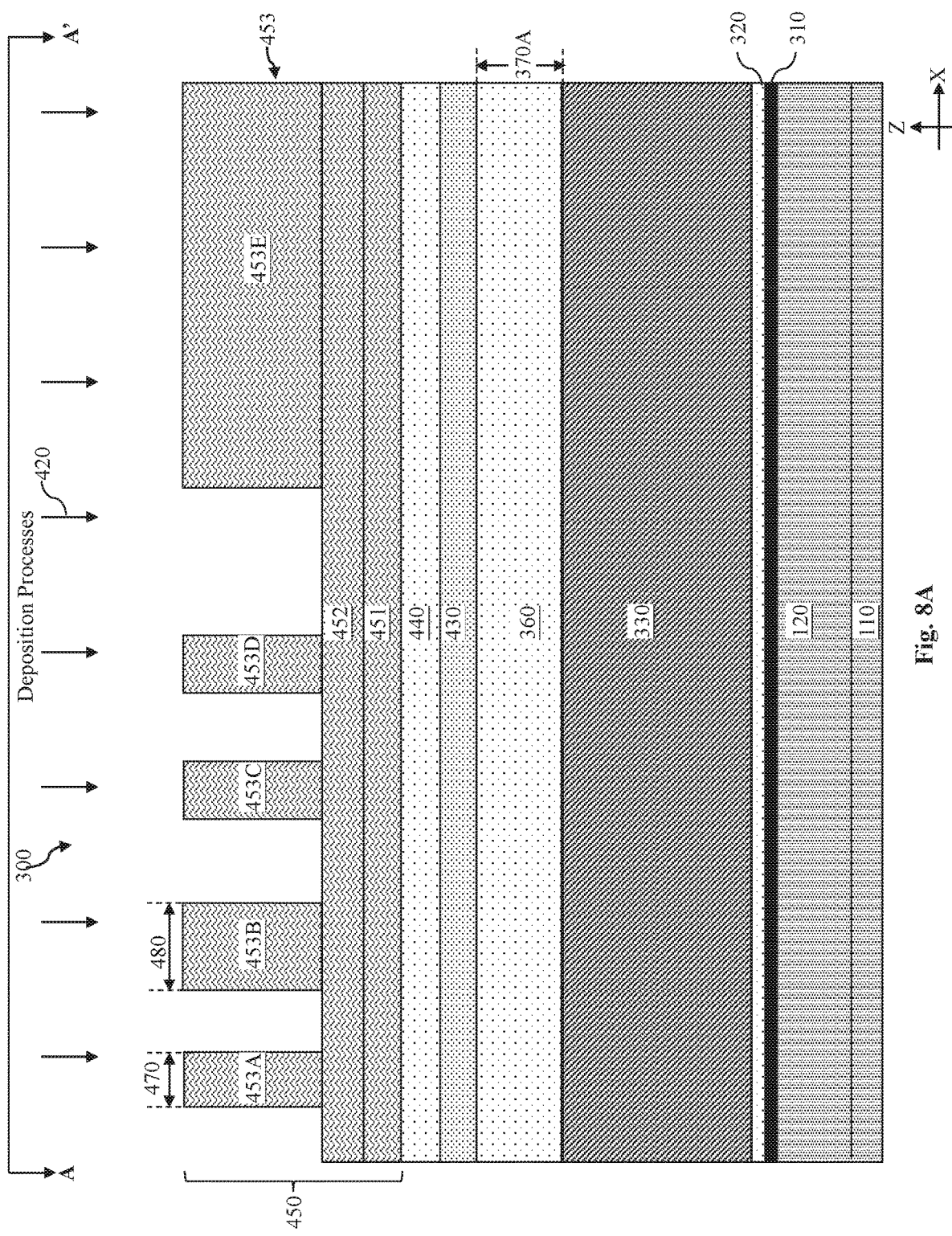
Figure 8B:
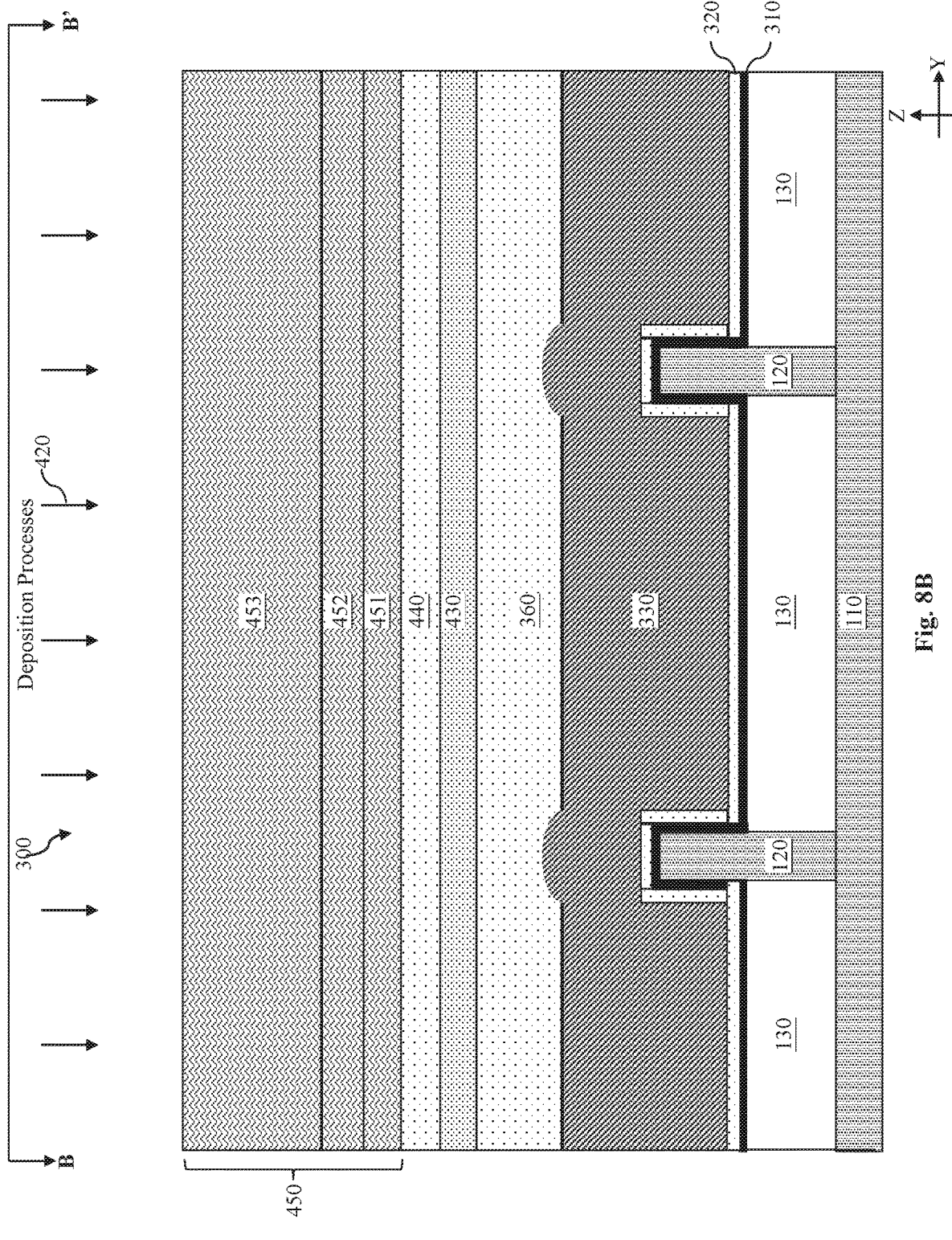

Referring now to FIGS. 8A-8B, a plurality of processes 420 are performed to the IC device 300 to form a plurality of layers over the dielectric layer 360. The process 420 may include deposition processes such as CVD, PVD, ALD, or combinations thereof, to deposit a plurality of layers. In some embodiments, the deposited layers include a hard mask layer 430 that is formed over the dielectric layer 360, and a dielectric layer 440 that is formed over the hard mask layer 430.

The processes 420 may also include a spin coating process to form a tri-layer photoresist material 450 over the dielectric layer 440. The tri-layer photoresist material 450 may include a bottom layer 451, a middle layer 452, and a top layer 453. A lithography process is then performed on the tri-layer photoresist material 450 to pattern the tri-layer photoresist material 450. The lithography process may include one or more exposure processes, baking processes, and developing processes. As a result, the top layer 453 is patterned into a plurality of segments, for example, into segments 453A, 453B, 453C, 453D, and 453E, as shown in FIG. 8A. The segment 453A will be used to define the lateral dimension of a gate structure of a non-memory device, for example, a logic device (e.g., the transistor 211B of FIG. 2B discussed above). Meanwhile, the segment 453B will be used to define the lateral dimension of a gate structure of a memory device, for example, an SRAM cell (e.g., the transistor 210B of FIG. 2B discussed above). As discussed above, the gate structure of the non-memory device should have a smaller dimension than the gate structure of the memory device according to aspects of the present disclosure. Accordingly, a dimension 470 (measured in the X-direction) of the segment 453A is smaller than a dimension 480 (also measured in the X-direction) of the segment 453B.

Figure 9A:
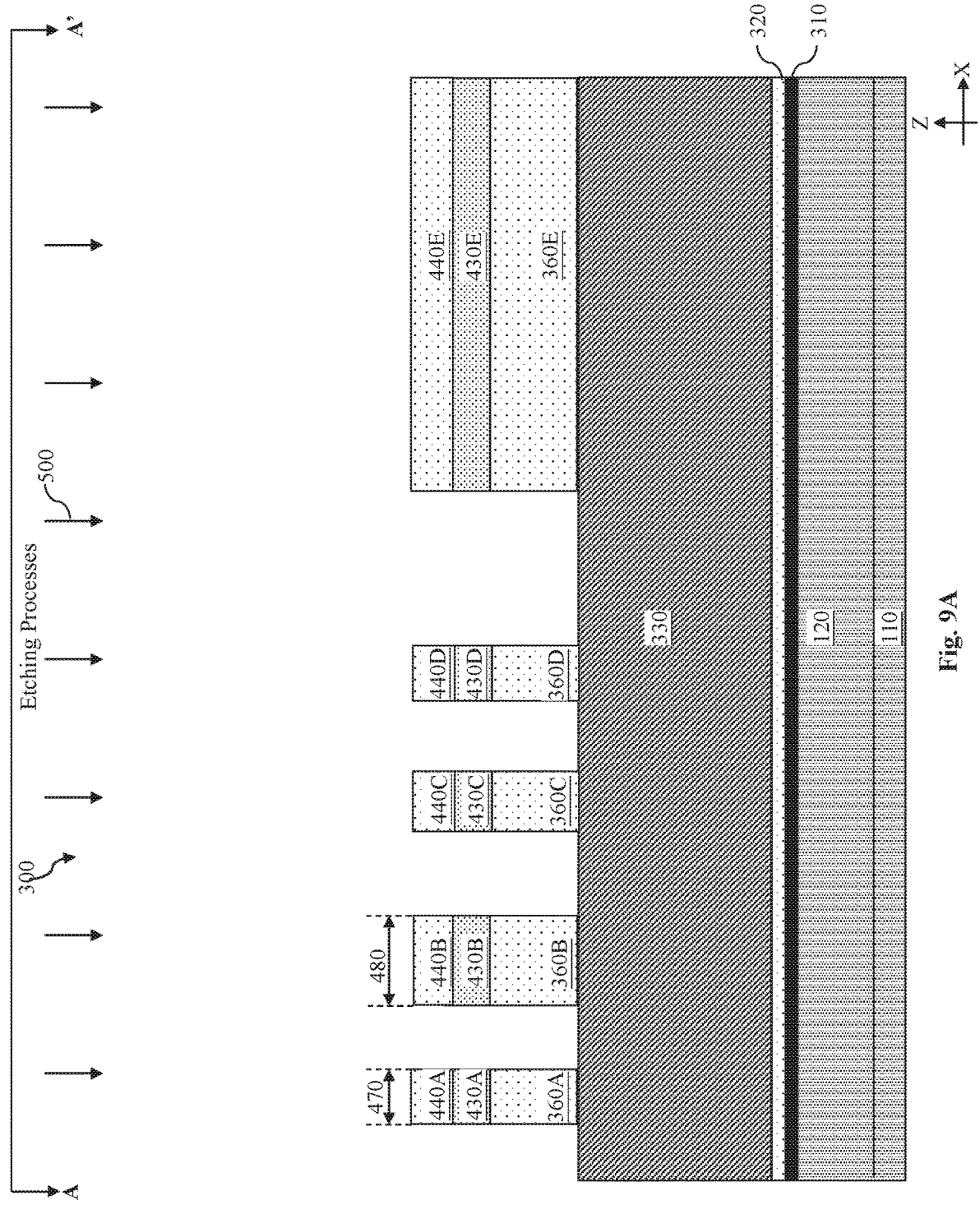
Figure 9B:
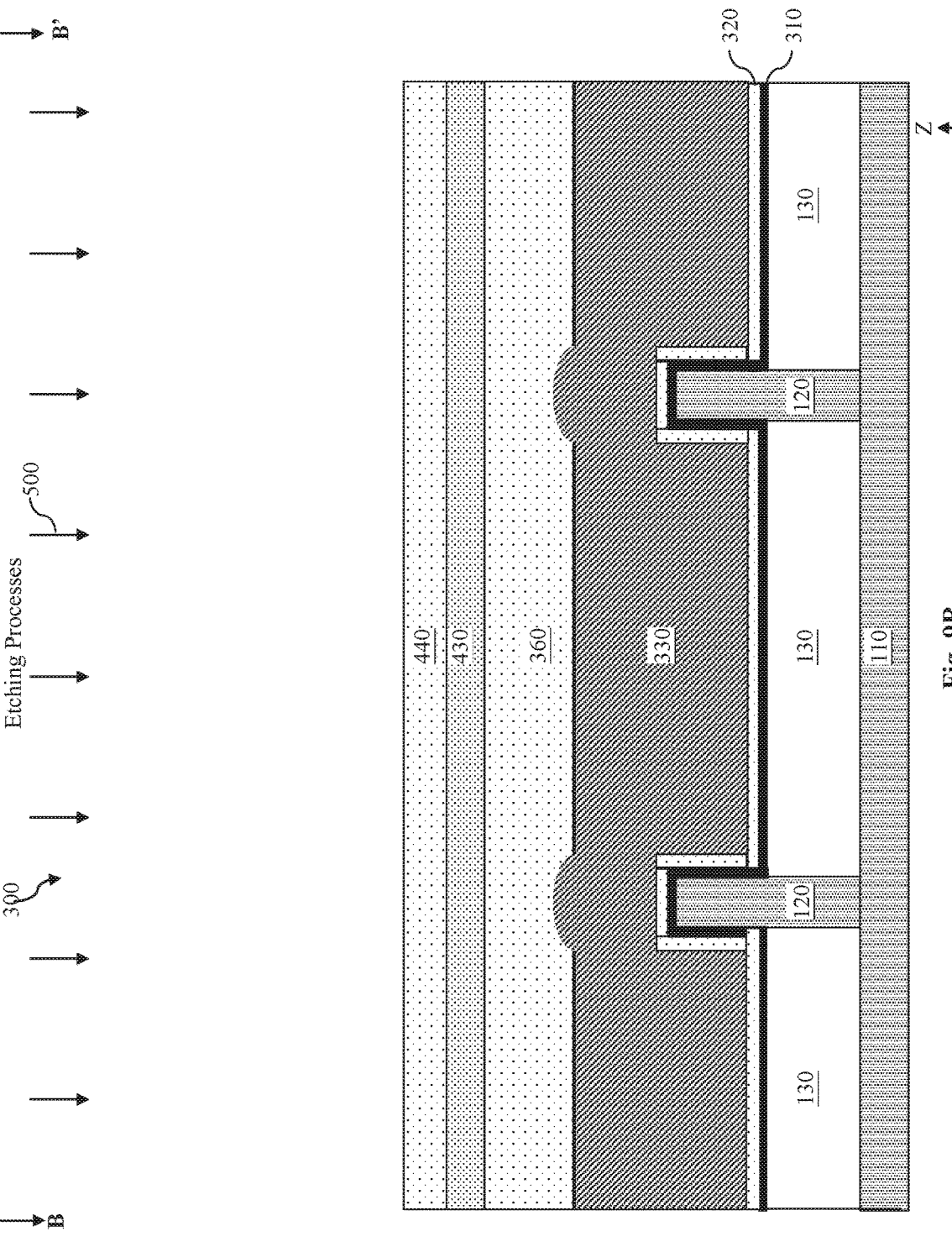

Referring now to FIGS. 9A-9B, one or more etching processes 500 are performed to the IC device 300. The one or more etching processes 500 may include a dry etching process in some embodiments. The segments 453A-453E of the top layer of the tri-layer photoresist material 450 serve as protective masks to protect the layers therebelow from being etched. In this manner, the patterns defined by the segments 453A-453E are transferred to the layers 440, 430, and 360, such that segments 440A-440E, 430A-430E, and 360A-360D (as shown in FIG. 9A) of these layers remain after the etching processes 500 are performed. These segments 440A-440E, 430A-430E, and 360A-360D may serve as hard masks to further pattern the dummy gate electrode layer 330, as discussed below. The tri-layer photoresist material 450 is removed (e.g., by a photoresist stripping or ashing process) after the segments 440A-440E, 430A-430E, and 360A-360D have been patterned. Note that the dimensions 470 and 480 are substantially inherited by the hard mask stacks formed by the segments 440A/430A/360A and 440B/430B/360B, respectively.

Figure 10A:
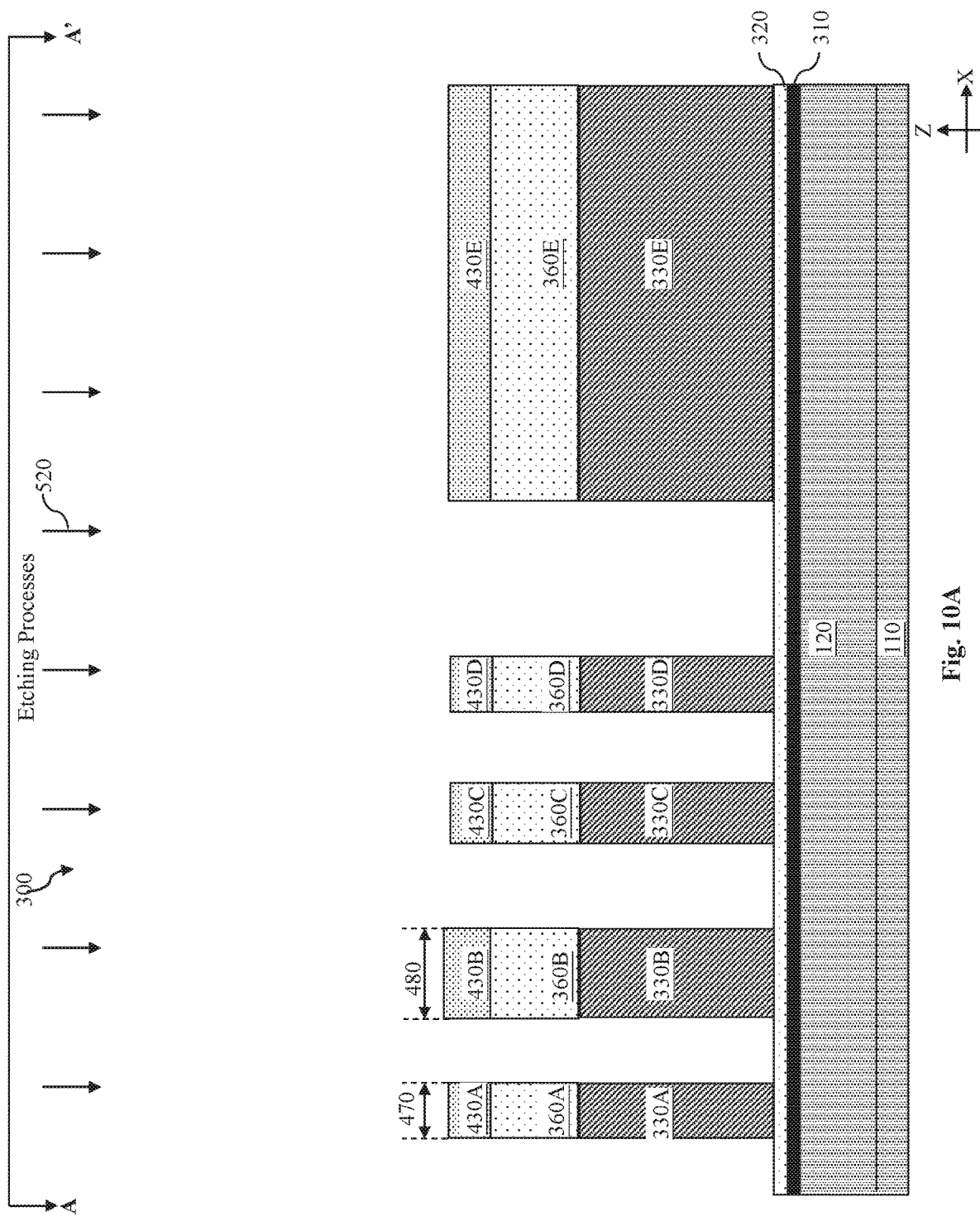
Figure 10B:
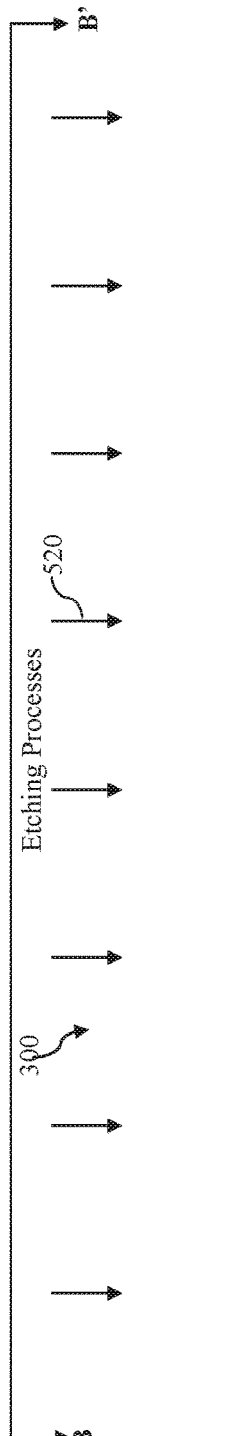
Figure 10B:
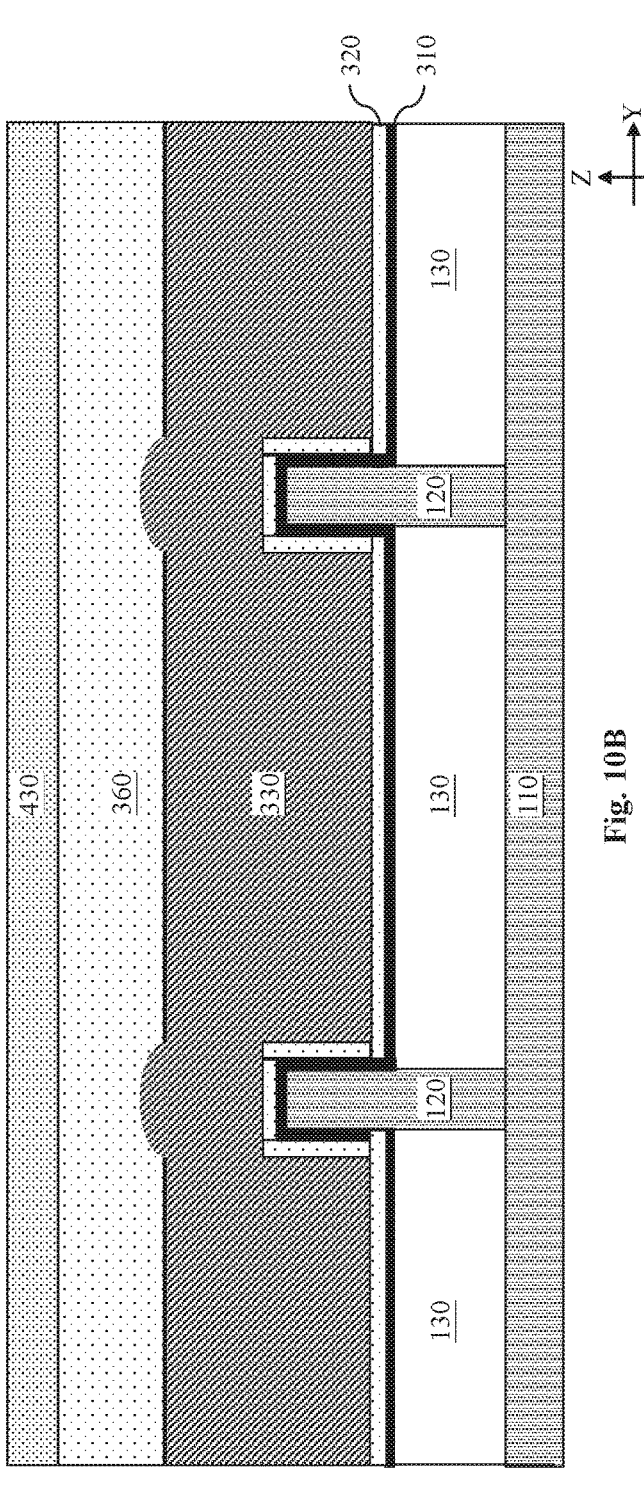

Referring now to FIGS. 10A-10B, one or more etching processes 520 are performed to the IC device 300. The one or more etching processes 520 may include a dry etching process in some embodiments. The stacks of hard mask segments 440A/430A/360A, 440B/430B/360B, 440C/430C/360C, 440D/430D/360D, and 440E/430E/360E (as shown in FIG. 10A) serve as protective masks during the etching processes 520 to protect the dummy gate electrode layer 330 therebelow, such that segments 330A, 330B, 330C, 330D, and 330E are formed by the remaining portions of the dummy gate electrode layer 330.

Again, the dimensions 470 and 480 are substantially inherited by the segments 330A and 330B of the dummy gate electrode layer 330, respectively. Since the segment 330A corresponds to the gate structure of a non-memory device, and since the segment 330B corresponds to the gate structure of a memory device, the fact that the dimension 470 is smaller than the dimension 480 will inherently result in a non-memory device having a narrower gate than the memory device, which has the various benefits of the present disclosure discussed above with reference to FIGS. 2A-2B.

Figure 11A:
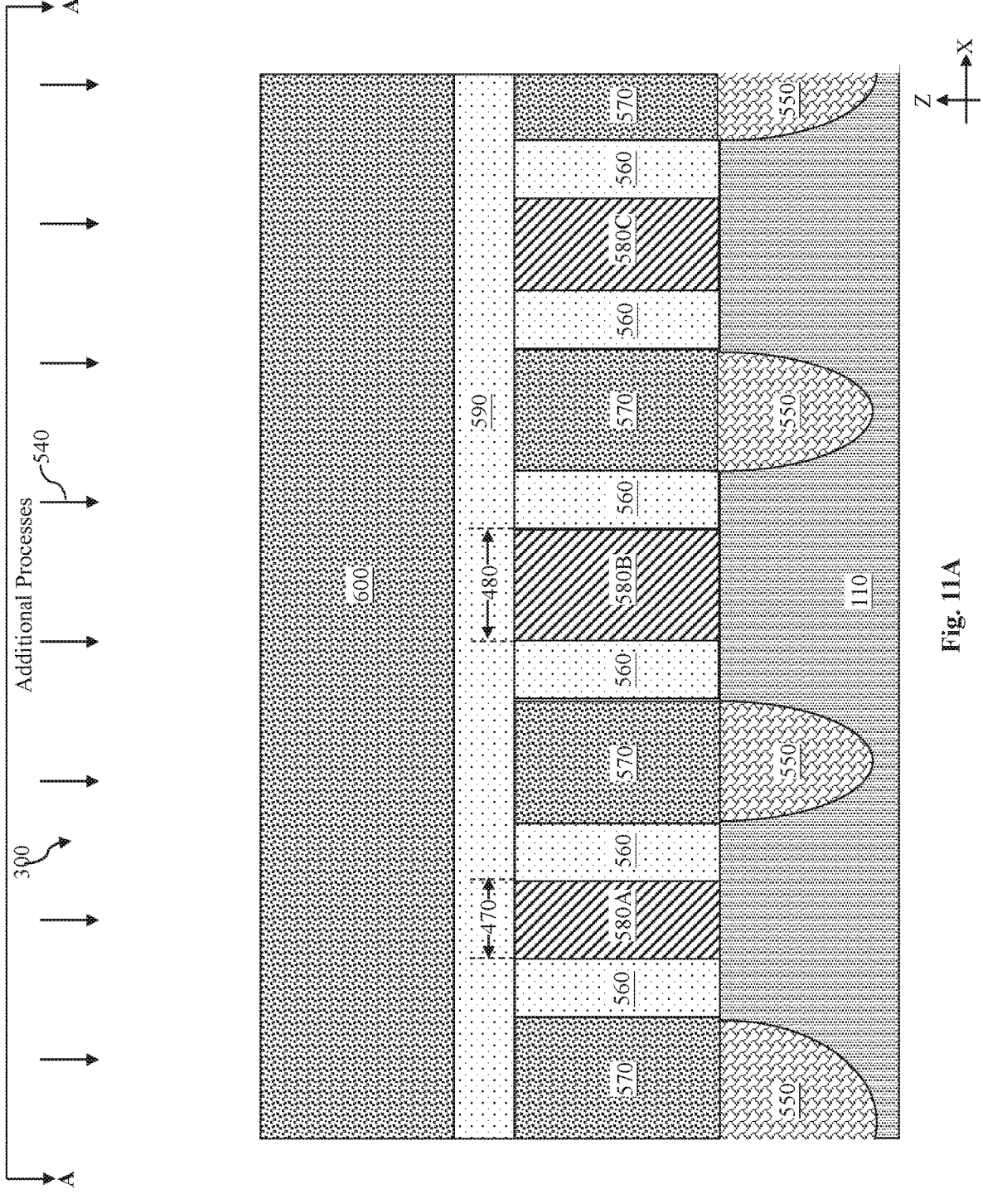

Referring now to FIG. 11A, a plurality of processes 540 may be performed to the IC device to continue its fabrication. Note that although FIG. 11A illustrates the X-cut cross-sectional view, it does not have a one-to-one correspondence with the X-cut cross-sectional view of FIG. 10A. Instead, the X-cut cross-sectional view of FIG. 11 is a more magnified version of the X-cut cross-sectional view of FIG. 10A, so as to more clearly illustrate the size differences between the gate structures of the memory devices and non-memory devices according to various aspects of the present disclosure.

The processes 540 may include the formation of source/drain regions 550. In that regard, the source/drain regions 550 may each refer to a source or a drain, individually or collectively, dependent upon the context. In some embodiments, the formation of the source/drain regions 550 may include one or more epitaxial growth processes. In some embodiments, the source/drain regions 550 include a semiconductor material, such as silicon, or silicon germanium.

The locations of the source/drain regions 550 may be at least partially defined by gate spacer structures 560. The gate spacer structures 560 are formed on sidewalls of the dummy gate structures (e.g., on the sidewalls of the segments 330A and 330B of the dummy gate electrode layer 330 of FIG. 10A). The gate spacer structures 560 may each include one or more dielectric layers, for example dielectric layers that contain silicon nitride (SiN), silicon carbon nitride (SiCN), or silicon carbon oxynitride (SiCON). In some embodiments, the gate spacer structures 560 may each include a plurality of gate spacer layers, which may have different material compositions. For example, in some embodiments, each of the gate spacer structures 560 may include a nitride spacer layer sandwiched by a first oxide spacer layer and a second oxide spacer layer. For reasons of simplicity, however, the detailed structures (e.g., the multiple spacer layers) of the gate spacer structures 560 are not illustrated herein in detail. The gate spacer structures 560 (and the dummy gate structures) are surrounded by, or embedded in, an ILD 570. In some embodiments, the ILD 570 includes silicon oxide, or a low-k dielectric material.

The processes 540 may also include a gate replacement process, in which the dummy gate structures (e.g., dummy gate structures containing the segments 330A-330C of the dummy gate electrode layer 330) are replaced with high-k metal gate (HKMG) structures 580A-580C, respectively. The HKMG structures 580A-580C may each include a high-k gate dielectric and a metal gate electrode. Example materials of the high-k gate dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or another suitable dielectric material having a dielectric constant greater than about 3.9. The metal gate electrode may include one or more work function metal layers and one or more fill metal layers. The work function metal layers may be configured to tune a work function of the respective transistor. Example materials for the work function metal layers may include titanium nitride (TiN), Titanium aluminide (TiAl), tantalum nitride (TaN), titanium carbide (TiC), tantalum carbide (TaC), tungsten carbide (WC), aluminum titanium nitride (TiAlN), zirconium aluminide (ZrAl), tungsten aluminide (WAl), tantalum aluminide (TaAl), hafnium aluminide (HfAl), or combinations thereof. The fill metal layer may serve as a main conductive portion of the gate electrode layer. In some embodiments, the HKMG structures 580A-580C may include additional layers, such as interfacial layers, capping layers, diffusion barrier layers, or other applicable layers.

As shown in FIG. 11A, the HKMG structure 580A has the dimension 470, and the HKMG structure 580B has the dimension 480. Again, the fabrication processes discussed above are specifically configured to ensure that the dimension 470 is smaller than the dimension 480, so as to optimize device performance. For example, in embodiments where the HKMG structure 580A is a gate structure of a non-memory device (e.g., a logic device), and the HKMG structure 580B is a gate structure of a memory device (e.g., an SRAM cell), the fact that the dimension 470 is smaller than the dimension 480 means that the leakage current and/or gate mismatch problems are substantially alleviated, which improves device performance and/or increases yield. Similar benefits may be achieved when the HKMG structure 580A is a gate structure of a higher speed device, but the HKMG structure 580B is a gate structure of a lower speed device.

In addition, although FIG. 11A illustrates the HKMG structures 580A and 580B as being disposed adjacent to one another, this is not intended to be limiting. In other embodiments, the HKMG structures 580A and 580B may belong to transistors that are located far apart from one another, for example, transistors that are located in different regions of the wafer. In that regard, different IC applications or circuits may be implemented in different regions of the wafer, and the different regions of the wafer may have different pattern densities. In some embodiments, the HKMG structure 580A may be implemented in a region of the wafer having a lower pattern density, while the HKMG structure 580B may be implemented in another region of the wafer having a higher pattern density. As discussed above with reference to FIGS. 2A-2B, the region of the wafer having the lower pattern density may not be as sensitive to gate mismatches as the region of the wafer having the higher pattern density. As such, the HKMG structure 580A may be implemented in the region of the wafer with the lower pattern density, while the HKMG structure 580B may be implemented in the region of the wafer with the higher pattern density. In such an embodiment, the enlarged HKMG structure 580B (having a wider width compared to the HKMG structure 580A) is less susceptible to issues caused by gate dimension mismatches, etc.

Still referring to FIG. 11A, a dielectric layer 590 may be formed over the HKMG structures 580, over the gate spacer structures 560, and over the ILD 570. In some embodiments, the dielectric layer 590 includes silicon nitride. An ILD 600 is formed over the dielectric layer 590. In some embodiments, the ILD 600 may include silicon oxide, or a low-k dielectric material.

Figure 12A:
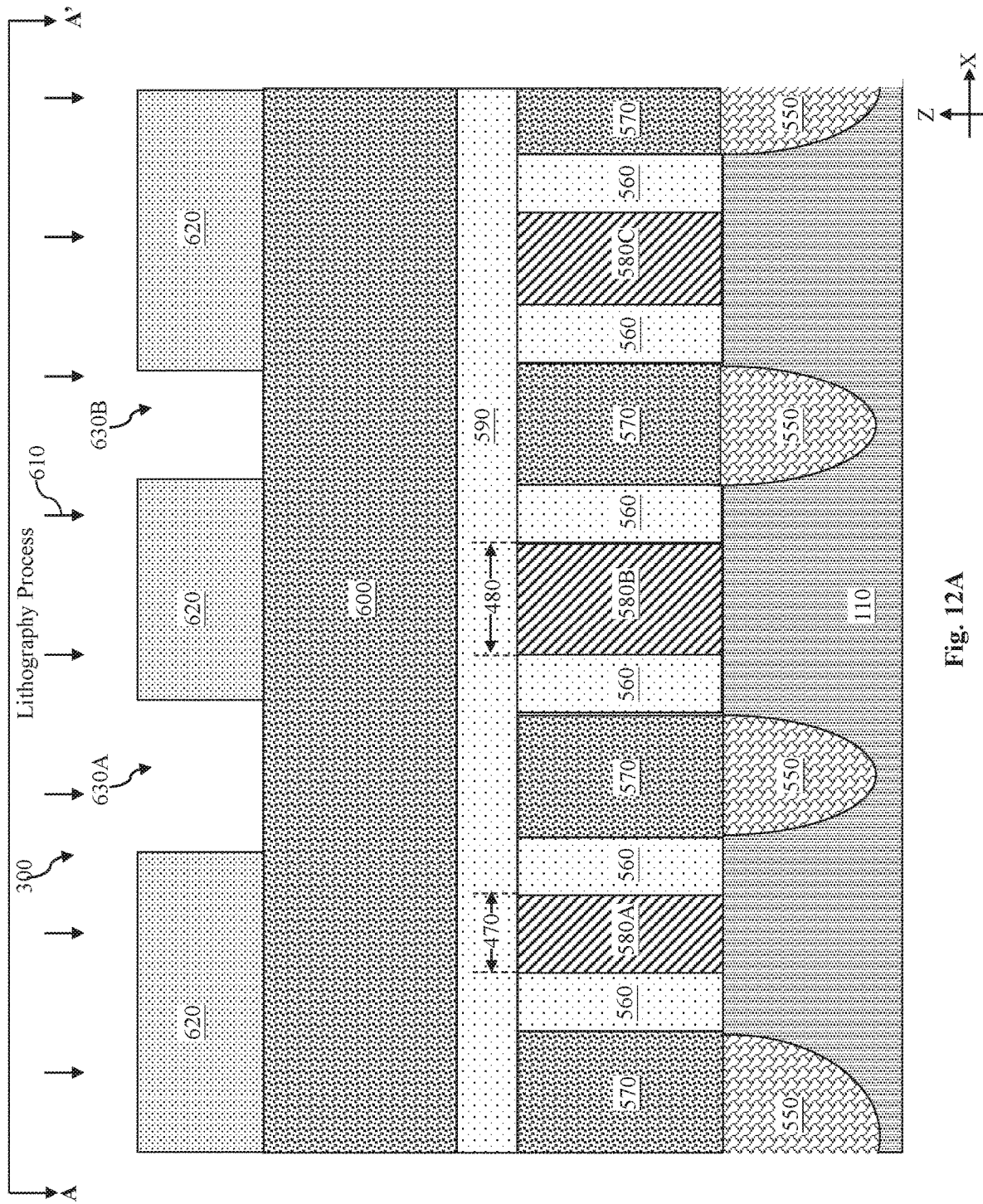

Referring now to FIG. 12A, a lithography process 610 is performed to form a patterned mask layer 620 over the ILD 600. The patterned mask layer 620 may be formed by depositing a dielectric structure (which may include multiple dielectric layers in some embodiments or a single dielectric layer in other embodiments) over the ILD 600, forming a patterned photoresist layer over the dielectric structure, and then patterning the dielectric structure with the patterned photoresist layer, the result of which is the patterned mask layer 620. The patterned mask layer 620 may define openings 630A and 630B. The opening 630A is located over the source/drain region 550 next to the HKMG structures 580A, and the opening 630B is located over the source/drain region 550 next to the HKMG structure 580B. This is because source/drain contact openings will be formed in portions of the ILD 570 over these source/drain regions 550 in a subsequent process. However, according to the various aspects of the present disclosure, the opening 630A is formed to be wider than the opening 630B, so that the source/drain contact formed under the opening 630A will be wider than the source/drain contact formed under the opening 630B.

Figure 13A:
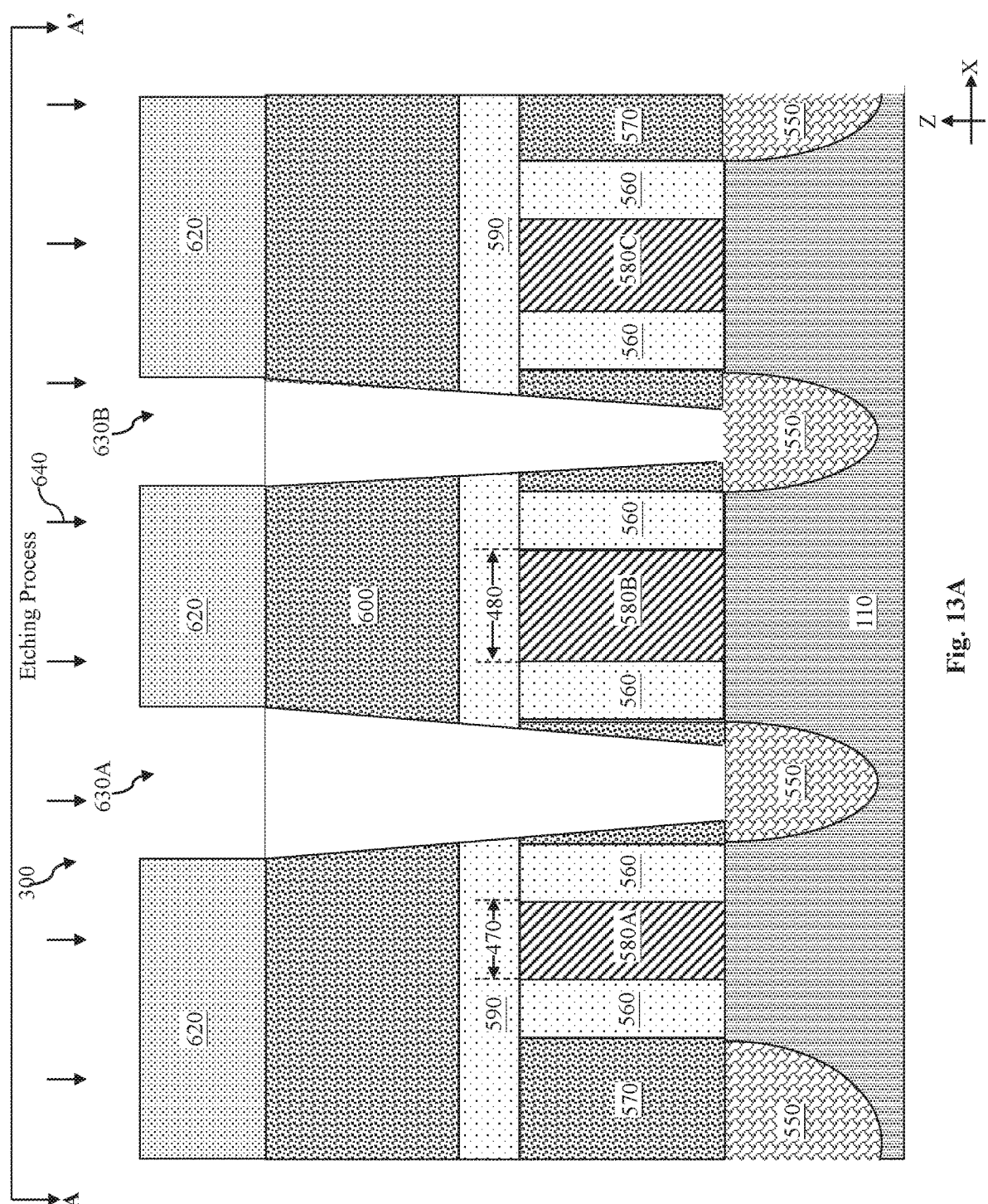

Referring now to FIG. 13A, an etching process 640 is performed to the IC device 300 to further extend the openings 630A and 630B vertically downward. For example, with the patterned mask layer 620 serving as a protective mask, the layers below the openings 630A and 630B are etched away by the etching process 640. The openings 630A and 630B extend through the ILD 600, the dielectric layer 590, and the ILD 570. The openings 630A and 630B also expose the upper surfaces of their respective source/drain regions 550 below.

Figure 14A:
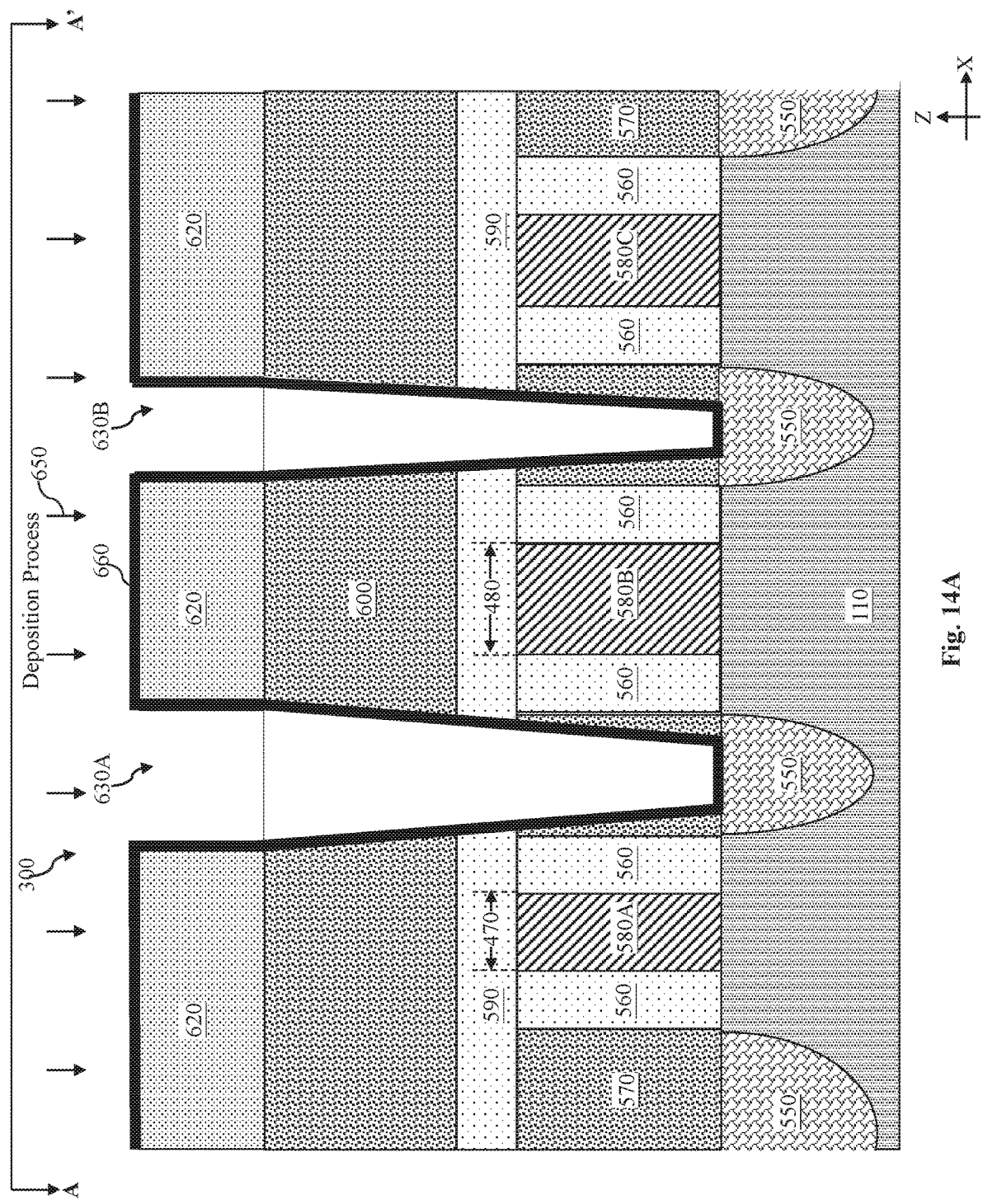

Referring now to FIG. 14A, a deposition process 650 is performed to the IC device 300 to form a liner 660 on the sidewalls of the openings 630A-630B. Portions of the liner 660 may also be formed over the patterned mask layer 620. The deposition process 650 may include CVD, PVD, ALD, or combinations thereof. In some embodiments, the liner 660 may include a conductive material.

Figure 15A:
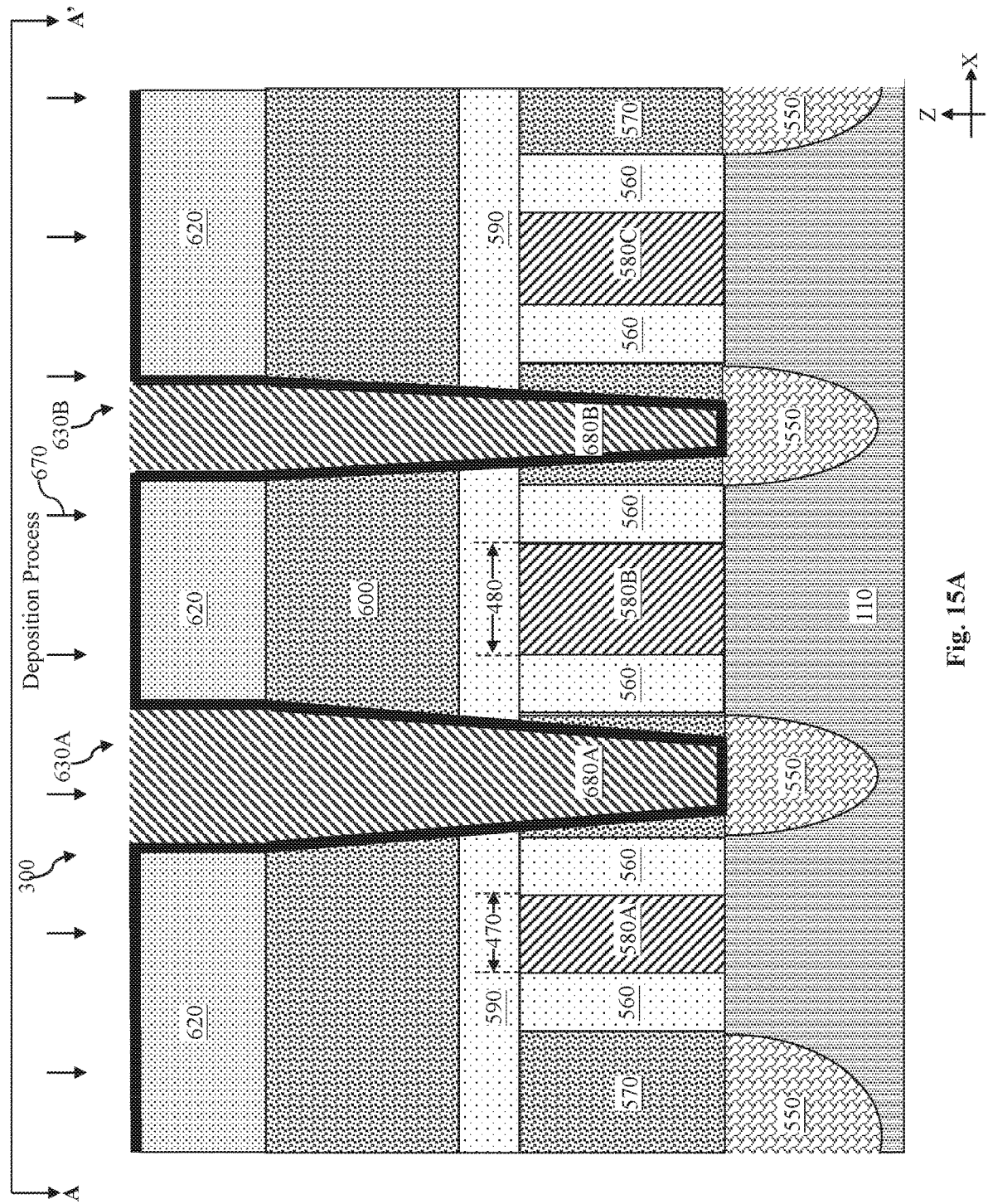

Referring now to FIG. 15A, a deposition process 670 is performed to the IC device 300 to form source/drain contacts 680A and 680B in the openings 630A and 630B, respectively. In some embodiments, the deposition process 670 fills openings 630A-630B with a conductive material, such as cobalt in some embodiments, or copper, aluminum, ruthenium, tungsten, titanium, or combinations thereof in other embodiments. Since the source/drain contacts 680A-680B are formed in the openings 630-630B, the openings 630A and 630B may also be referred to as a source/drain contact openings or source/drain contact holes.

Figure 16A:
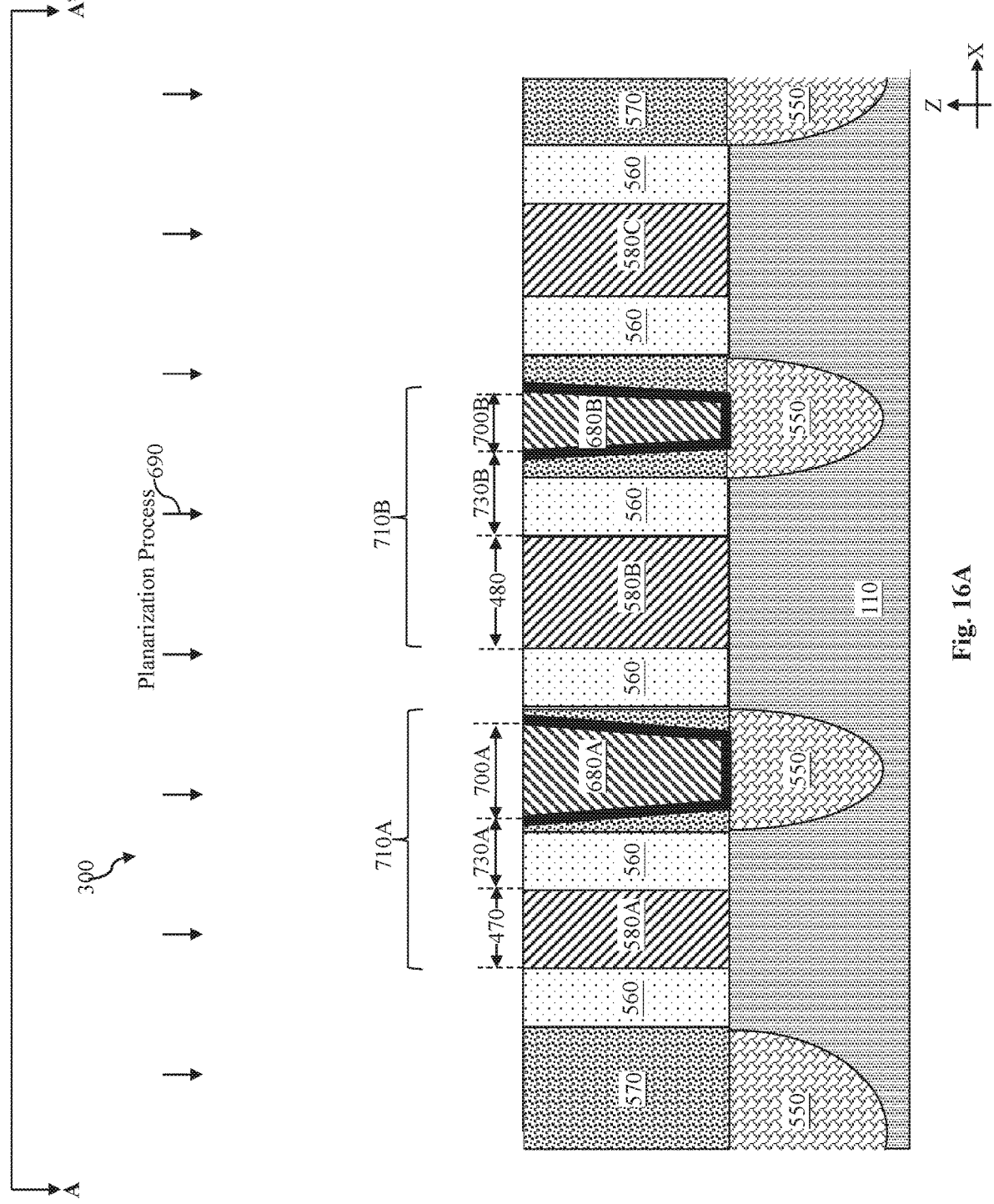

Referring now to FIG. 16A, a planarization process 690 is performed to the IC device 300 to remove the patterned mask layer 620, the ILD 600, the dielectric layer 590, and portions of the source/drain contacts 680A-680B. The remaining portions of the source/drain contacts 680A and 680B have upper surfaces that are substantially co-planar with the upper surfaces of the HKMG structures 580A and 580B. Note that, as an inherent result of the source/drain contact opening 630A being configured to be wider than the source/drain contact opening 630B (see FIG. 12A), the source/drain contact 680A is also wider than the source/drain contact 680B. For example, the source/drain contact 680A may have a maximum lateral dimension 700A (measured in the X-direction), and the source/drain contact 680B may have a maximum lateral dimension 700B (also measured in the X-direction). The maximum lateral dimensions 700A and 700B may be measured at or near an uppermost surface of their respective source/drain contacts 680A and 680B in some embodiments. The maximum lateral dimensions 700A is greater than the maximum lateral dimensions 700B, so that a transistor 710A (of which the source/drain contact 680A and the HKMG structure 580A are components) has reduced parasitic resistance and improved drain saturation current compared to a transistor 710B (of which the source/drain contact 680B and the HKMG structure 580B are components). As discussed above, this is because parasitic resistance and drain saturation current are more important considerations for non-memory devices (e.g., the transistor 710A) than for memory devices (e.g., the transistor 710B). It is understood that the transistors 710A and 710B may be embodiments of the transistors 211B and 210B, respectively, of the revised IC layout design 200B discussed above with reference to FIG. 2B.

In some embodiments, the maximum lateral dimensions 700A is in a range between about 14 nanometers and about 15.5 nanometers, while the maximum lateral dimensions 700B is in a range between about 13 nanometers and about 14 nanometers. In some embodiments, a ratio between the maximum lateral dimensions 700A and the maximum lateral dimensions 700B is in a range between about 1.01:1 and about 1.2:1. Meanwhile, the dimension 470 of the HKMG structure 580A is in a range between about 15.5 and about 16 nanometers, and the dimension 480 of the HKMG structure 580B is in a range between about 15.5 and about 16.5 nanometers. In some embodiments, a ratio between the dimension 480 and the dimension 470 is in a range between about 1.07:1 and about 1.01:1. The transistors 710A and 710B have different ratios between their HKMG structures and source/drain contacts as well. For example, for the transistor 710B, a first ratio may be defined by the dimension 480 (of the HKMG structure 580B) and the dimension 700B (of the source/drain contact 680B). Meanwhile, for the transistor 710A, a second ratio may be defined by the dimension 470 (of the HKMG structure 580A) and the dimension 700A (of the source/drain contact 680A). A value of the first ratio is different than a value of the second ratio. For example, the first ratio is greater than the second ratio in some embodiments. In some embodiments, the first ratio may be in a range between about 1:1 and about 1.15:1, while the second ratio may be in a range between about 0.9:1 and about 1.04:1.

As discussed above with reference to FIG. 2B, these ranges are not randomly chosen but specifically configured to optimize the device performance. In other words, the above ranges ensure an optimal tradeoff between considerations such as leakage current, gate size mismatch, parasitic resistance, and/or drain saturation current. It is also understood that, in some embodiments, a distance 730A separating the HKMG structure 580A and the source/drain contact 680A may be substantially equal to a distance 730B separating the HKMG structure 580B and the source/drain contact 680B. For example, a ratio between the distance 730A and the distance 730B may be in a range between about 0.99:1 and about 1.01:1. This means that the enlargement of the HKMG structure 580B and the enlargement of the source/drain contact 680A can be performed without substantially affecting the overall size of the transistors 710A and 710B.

Figure 17:
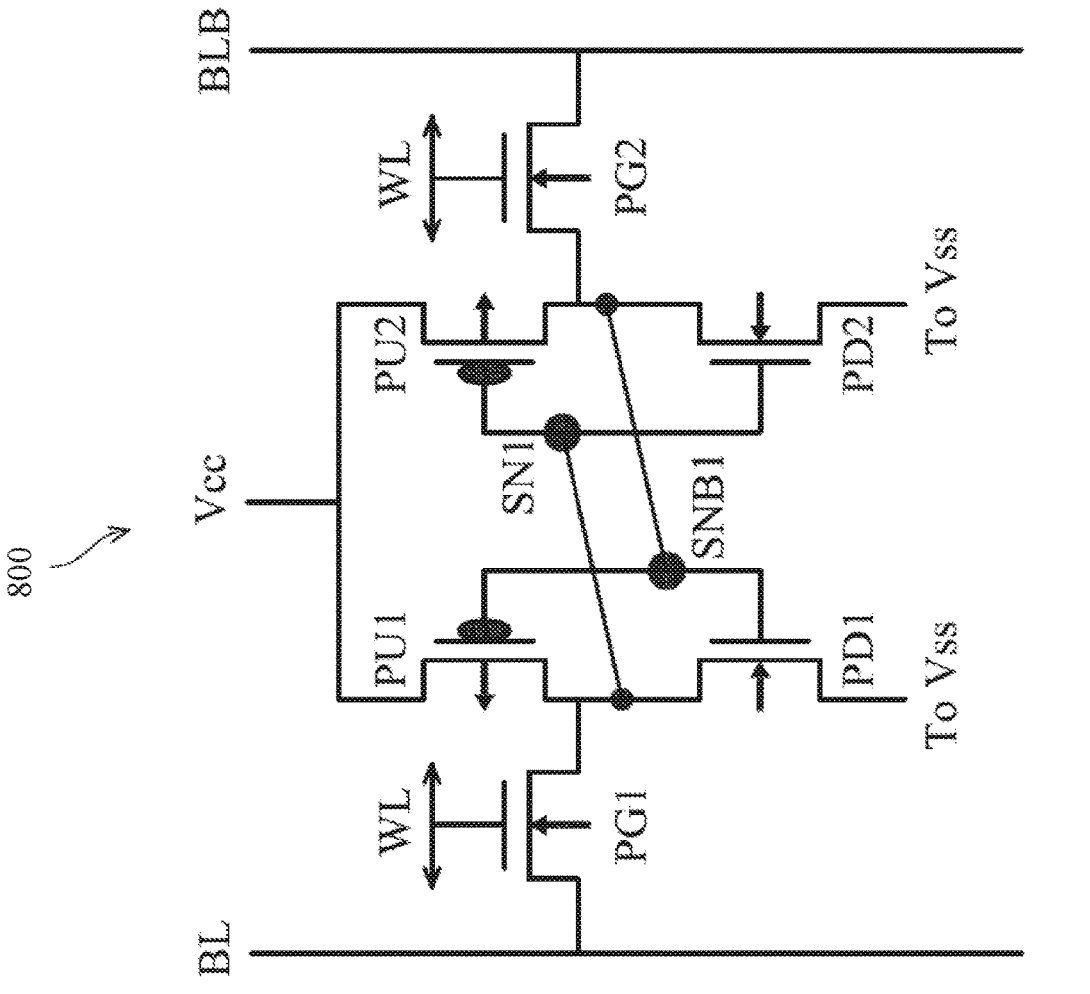
FIG. 17 is a circuit schematic of an SRAM cell according to various aspects of the present disclosure.

FIG. 17 illustrates an example type of memory device in which the transistor 710B may be implemented. In that regard, FIG. 17 illustrates the circuit schematic of an example Static Random-Access Memory (SRAM) device, for example, as a single-port SRAM cell (e.g., 1-bit SRAM cell) 800. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell. Regardless, the transistor 710A may be used to implement the PG1, PG2, PD1, PD2, PU1, and/or the PU2 transistors.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node SN1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

Figure 18:
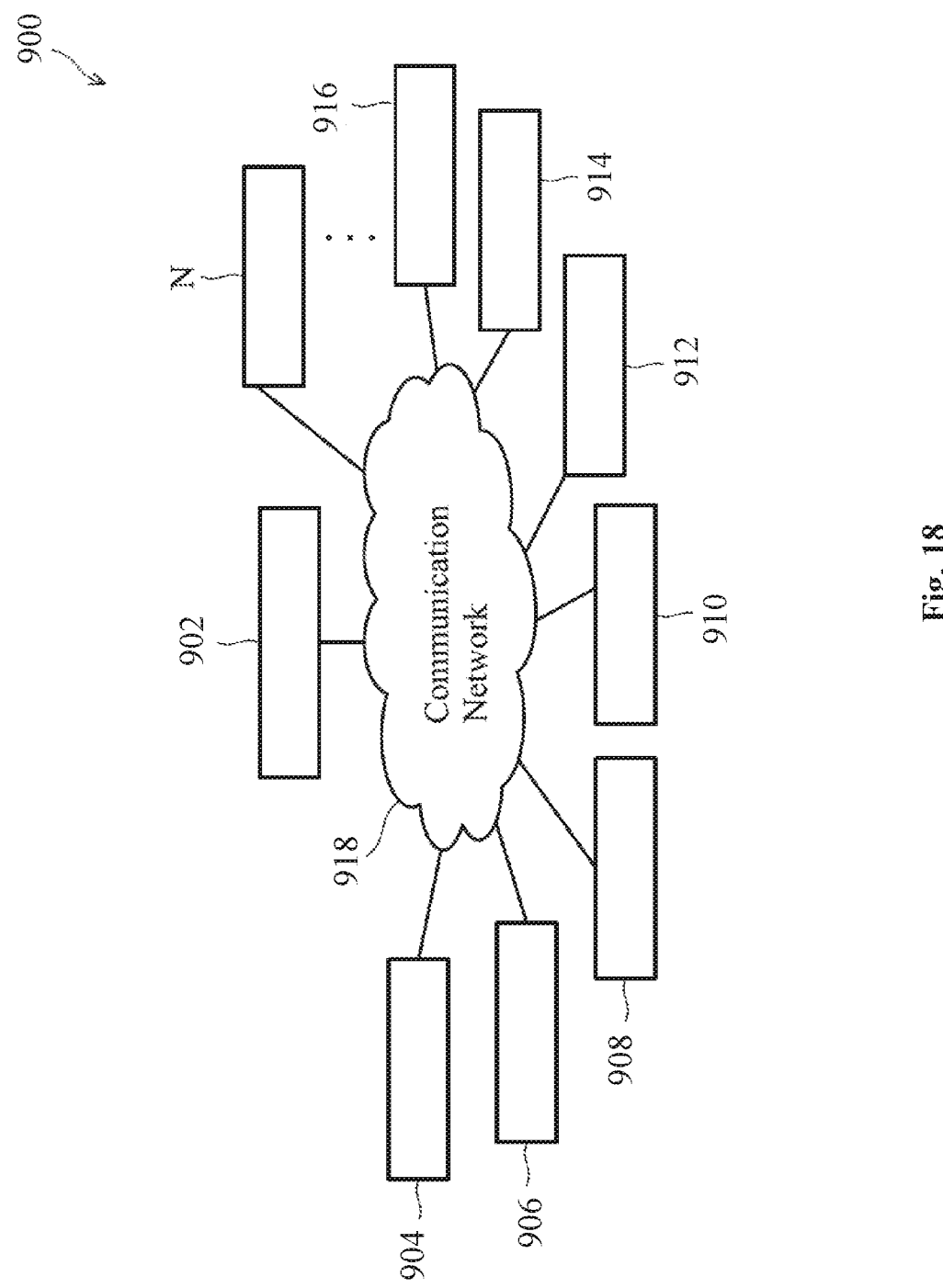
FIG. 18 is a block diagram of a manufacturing system according to various aspects of the present disclosure.

FIG. 18 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

FIG. 19 is a flowchart illustrating a method 1000 of revising an IC layout design according to embodiments of the present disclosure. The method 1000 includes a step 1010 to receive an integrated circuit (IC) layout design. The IC layout design includes a first transistor and a second transistor. The first transistor includes a first gate and a first source/drain contact. The second transistor includes a second gate and a second source/drain contact. In some embodiments, the IC layout design is in the format of a Graphic Data System (GDS) file, which includes solder masks, geometry, layers, component labels, and the general layout of a circuit. The GDS file may have a binary format.

The method 1000 includes a step 1020 to revise the IC layout design at least in part by: enlarging the first gate in a top view, shrinking the first source/drain contact in the top view, shrinking the second gate in the top view, and enlarging the second source/drain contact in the top view. The revised IC layout design may also be saved in the GDS file format.

The method 1000 includes a step 1030 to fabricate an IC device based on the revised IC layout design.

According to the received IC layout design, the first gate is spaced apart from the first source/drain contact in a first direction in the top view. In some embodiments, the enlarging of the first gate, the shrinking of the first source/drain contact, the shrinking of the second gate, and the enlarging of the second source/drain contact are performed in the first direction. In some embodiments, according to the received IC layout design, the first gate and the second gate have substantially similar dimensions in the first direction in the top view, and the first source/drain contact and the second source/drain contact have substantially similar dimensions in the first direction in the top view.

In some embodiments, according to the received IC layout design, the first transistor is a part of a static random access memory (SRAM) cell, and the second transistor is a part of a logic device different from the SRAM cell.

It is understood that the method 1000 may include further steps performed before, during, or after the steps 1010-1030. For example, the method 1000 may include steps of performing error checks, etc. For reasons of simplicity, these additional steps are not discussed herein in detail.

FIG. 20 is a flowchart illustrating a method 1100 of fabricating a semiconductor device according to embodiments of the present disclosure. The method 1100 includes a step 1110 to form a patterned dummy gate electrode layer. The patterned dummy gate electrode layer includes a first segment having a first lateral dimension and a second segment having a second lateral dimension different from the first lateral dimension in value.

The method 1100 includes a step 1120 to replace the patterned dummy gate electrode layer with a metal-containing gate electrode layer. The metal-containing gate electrode layer includes a first metal-containing gate having the first lateral dimension and a second metal-containing gate having the second lateral dimension. The first metal-containing gate is separated from the second metal-containing gate at least in part by an interlayer dielectric (ILD).

The method 1100 includes a step 1130 to etch a first source/drain contact opening in a first portion of the ILD adjacent to the first metal-containing gate and a second source/drain contact opening in a second portion of the ILD adjacent to the second metal-containing gate. The first source/drain contact opening is etched to have a third lateral dimension. The second source/drain contact opening is etched to have a fourth lateral dimension different from the third lateral dimension in value.

The method 1100 includes a step 1140 to fill the first source/drain contact opening and the second source/drain contact opening with a conductive material, thereby forming a first source/drain contact in the first source/drain contact opening and a second source/drain contact in the second source/drain contact opening.

In some embodiments, the first metal-containing gate and the first source/drain contact are components of a static random access memory (SRAM) cell. The second metal-containing gate and the second source/drain contact are components of a logic device that is different from the SRAM cell. The patterned dummy gate electrode layer is formed such that the first lateral dimension is greater than the second lateral dimension. The etching is performed such that the fourth lateral dimension is greater than the third lateral dimension.

In some embodiments, the first metal-containing gate and the first source/drain contact are components of a first transistor. The second metal-containing gate and the second source/drain contact are components of a second transistor. The first transistor and the second transistor have different speeds or are located in different regions of a wafer with different pattern densities.

In some embodiments, the step 1110 to form the patterned dummy gate electrode layer includes: forming one or more mask layers over the dummy gate electrode layer; forming a patterned photoresist layer over the one or more mask layers, wherein the patterned photoresist layer includes at least a first photoresist portion having the first lateral dimension and a second photoresist portion having the second lateral dimension; patterning the one or more mask layers with the patterned photoresist layer, wherein the patterned one or more mask layers include a first mask portion patterned by the first photoresist portion and a second mask portion patterned by the second photoresist portion; and patterning the dummy gate electrode layer with the patterned one or more mask layers.

It is understood that the method 1100 may include further steps performed before, during, or after the steps 1110-1140. For example, the method 1100 may include forming gate spacers, forming source/drain regions, forming interlayer dielectric (ILD), forming an interconnect structure, etc. For reasons of simplicity, these additional steps are not discussed herein in detail.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

In summary, the present disclosure configures the sizes of the gate structures and source/drain contacts differently for different transistors. For example, the gate structures of memory devices (e.g., SRAM cells) are configured to have larger sizes than the gate structures of non-memory devices (e.g., logic devices such as microcontrollers), while the source/drain contacts of the memory devices are configured to have smaller sizes than the source/drain contacts of the non-memory devices. As another example, the gate structures of transistors in a higher density region are configured to have larger sizes than the gate structures of transistors in a lower density region, while the source/drain contacts of the transistors in the higher density region are configured to have smaller sizes than the source/drain contacts of the transistors in the lower density region. As a further example, the gate structures of transistors having a lower speed are configured to have larger sizes than the gate structures of transistors having a higher speed, while the source/drain contacts of the transistors having the lower speed are configured to have smaller sizes than the source/drain contacts of transistors having the higher speed. In some embodiments, an original IC layout design may be revised to resize the gate structures and/or the source/drain contacts. For example, according to the original IC layout design, the gate structures of different transistors (e.g., SRAM transistors v.s. logic device transistors) may have substantially the same sizes, as are the source/drain contacts of the different transistors. The original IC layout design may be revised by enlarging the gate structures of a first subset of the transistors while shrinking the gate structures of a second subset of the transistors, as well as by shrinking the source/drain contacts of the first subset of the transistors while enlarging the source/drain contacts of the second subset of the transistors.

Sizing the gate structures differently for different transistors, as well as sizing the source/drain contacts differently for different transistors may offer advantages over conventional devices. However, it is understood that not all advantages are discussed herein, different embodiments may offer different advantages, and that no particular advantage is required for any embodiment. One advantage is that the device performance is optimized for the different transistors based on their needs and applications. For example, for memory devices such as SRAM cells, leakage current (e.g., due to a short channel effect or drain induced barrier lowering) or mismatch between gate sizes may be an important concern. Therefore, to improve the performance of the SRAM cells (e.g., to reduce the leakage current), the size of the gate structure of the transistors of the SRAM cells is enlarged. On the other hand, for non-memory devices such as logic devices (e.g., microcontrollers), parasitic resistance or drain saturation current may be important concerns. Therefore, to improve the performance of the non-memory devices (e.g., to reduce the parasitic resistance and increase the drain saturation current), the size of the source/drain contacts of the transistors of the non-memory devices may be enlarged.

Note that for both the memory devices and the non-memory devices, it may still be desirable to keep a minimum distance between a gate structure and an adjacent source/drain contact. Therefore, in the memory devices where the gate structure is enlarged, the source/drain contact may be shrunk, so as to maintain the same distance therebetween, which helps to reduce electrical shorting risks. Similarly, in the non-memory devices where the source/drain contact is enlarged, the gate structure may be shrunk, also to maintain the same distance therebetween.

It is understood that the advantages discussed above (e.g., reduced leakage current, reduced gate mismatch, reduced parasitic resistance, and/or enhanced drain saturation current) may apply not to just memory devices and non-memory devices, but also to other different transistors as well. For example, for transistors in a higher density region, leakage current and/or mismatch between gates may be a greater concern compared to transistors in a lower density region. Therefore, the gate structures may be enlarged for the transistors in the higher density region. On the other hand, for higher speed transistors, parasitic resistance and/or drain saturation current may be a greater concern compared to lower speed transistors. Therefore, the source/drain contacts may be enlarged for the higher speed transistor.

Other advantages may include compatibility with existing fabrication processes (including for both FinFET and GAA processes) and the ease and low cost of implementation.

One aspect of the present disclosure pertains to a device. A first transistor includes a first gate, a first source/drain, and a first source/drain contact disposed over the first source/drain. The first gate has a first dimension measured in a first lateral direction. The first source/drain contact has a second dimension measured in the first lateral direction. A second transistor includes a second gate, a second source/drain, and a second source/drain contact disposed over the second source/drain. The second gate has a third dimension measured in the first lateral direction. The second source/drain contact has a fourth dimension measured in the first lateral direction. A first ratio of the first dimension and the second dimension is different from a second ratio of the third dimension and the fourth dimension.

Another aspect of the present disclosure pertains to a method of revising an IC layout design. An integrated circuit (IC) layout design is received. The received IC layout design includes a first transistor and a second transistor. The first transistor includes a first gate and a first source/drain contact. The second transistor includes a second gate and a second source/drain contact. The IC layout design is revised at least in part by: enlarging the first gate in a top view; shrinking the first source/drain contact in the top view; shrinking the second gate in the top view; and enlarging the second source/drain contact in the top view.

Another aspect of the present disclosure pertains to a method of fabricating a semiconductor device. A patterned dummy gate electrode layer is formed. The patterned dummy gate electrode layer includes a first segment having a first lateral dimension and a second segment having a second lateral dimension different from the first lateral dimension in value. The patterned dummy gate electrode layer is replaced with a metal-containing gate electrode layer. The metal-containing gate electrode layer includes a first metal-containing gate having the first lateral dimension and a second metal-containing gate having the second lateral dimension. The first metal-containing gate is separated from the second metal-containing gate at least in part by an interlayer dielectric (ILD). A first source/drain contact opening is etched in a first portion of the ILD adjacent to the first metal-containing gate and a second source/drain contact opening is etched in a second portion of the ILD adjacent to the second metal-containing gate. The first source/drain contact opening is etched to have a third lateral dimension. The second source/drain contact opening is etched to have a fourth lateral dimension different from the third lateral dimension in value. The first source/drain contact opening and the second source/drain contact opening are filled with a conductive material, thereby forming a first source/drain contact in the first source/drain contact opening and a second source/drain contact in the second source/drain contact opening.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A device, comprising:
a first transistor that comprises a first gate, a first source/drain, and a first source/drain contact disposed over the first source/drain, wherein:
the first gate has a first dimension measured in a first lateral direction, and
the first source/drain contact has a second dimension measured in the first lateral direction; and
a second transistor that comprises a second gate, a second source/drain, and a second source/drain contact disposed over the second source/drain, wherein:
the second gate has a third dimension measured in the first lateral direction,
the second source/drain contact has a fourth dimension measured in the first lateral direction,
a first ratio of the first dimension and the second dimension is different from a second ratio of the third dimension and the fourth dimension;
the first transistor is a part of an electronic memory storage device;
the second transistor is a part of a logic device that is not the electronic memory storage device;

the first dimension is greater than the third dimension; and the second dimension is less than the fourth dimension.

2. The device of claim 1, wherein:

the electronic memory storage device comprises a static random access memory (SRAM) cell; and the logic device comprises a controller for operating the SRAM cell.

3. The device of claim 1, wherein the first ratio is greater than the second ratio.

4. The device of claim 1, wherein the first transistor and the second transistor have different operational speeds.

5. The device of claim 1, wherein:

the first transistor is implemented in a first region of a wafer;

the second transistor is implemented in a second region of the wafer; and the first region of the wafer and the second region of the wafer have different pattern densities.

6. The device of claim 1, wherein:

the first gate is separated from the first source/drain contact by a first distance in the first lateral direction;

the second gate is separated from the second source/drain contact by a second distance in the first lateral direction; and the first distance is substantially equal to the second distance.

7. A device, comprising:

a first gate disposed over a substrate;

a first source/drain disposed in a first portion of the substrate adjacent to the first gate;

a first source/drain contact disposed over the first source/drain;

a second gate disposed over the substrate;

a second source/drain disposed in a second portion of the substrate adjacent to the second gate; and a second source/drain contact disposed over the second source/drain;

wherein:

the first gate is wider than the second gate in a first horizontal direction;

the first source/drain contact is narrower than the second source/drain contact in the first horizontal direction;

the first gate and the first source/drain are components of a first type of transistor;

the second gate and the second source/drain are components of a second type of transistor different from the first type of transistor;

the first type of transistor is part of a memory device; and the second type of transistor is part of a non-memory device.

8. The device of claim 7, wherein:

the memory device comprises a Static Random Access Memory (SRAM) device; and the non-memory device is a part of a microcontroller configured to control an operation of the SRAM device.

9. The device of claim 7, wherein:

the first type of transistor has a first operational speed; and the second type of transistor has a second operational speed different from the first operational speed.

10. The device of claim 7, wherein:

the first gate and the first source/drain are implemented in a first region of the substrate;

the second gate and the second source/drain are implemented in a second region of the substrate; and the first region of the substrate and the second region of the substrate have different pattern densities.

11. The device of claim 7, further comprising:

a first gate spacer disposed between the first gate and the first source/drain; and a second gate spacer disposed between the second gate and the second source/drain; wherein the first gate spacer and the second gate spacer have substantially similar widths.

12. The device of claim 7, further comprising:

a first gate spacer disposed between the first gate and the first source/drain; and a second gate spacer disposed between the second gate and the second source/drain, wherein a width of the first gate spacer is equal to a width of the second gate spacer in the first horizontal direction.

13. A device, comprising:

a first gate disposed over a substrate;

a first source/drain disposed in a first portion of the substrate adjacent to the first gate;

a first source/drain contact disposed over the first source/drain;

a second gate disposed over the substrate;

a second source/drain disposed in a second portion of the substrate adjacent to the second gate; and a second source/drain contact disposed over the second source/drain;

wherein:

the first gate is wider than the second gate in a first horizontal direction;

the first source/drain contact is narrower than the second source/drain contact in the first horizontal direction;

the first gate and the first source/drain are components of a first type of transistor;

the second gate and the second source/drain are components of a second type of transistor different from the first type of transistor;

the first type of transistor is part of a non-memory device; and the second type of transistor is part of a memory device.

14. The device of claim 13, wherein:

the memory device comprises a Static Random Access Memory (SRAM) device.

15. The device of claim 14, wherein:

the non-memory device is a part of a microcontroller configured to control an operation of the SRAM device.

16. The device of claim 13, wherein:

the first type of transistor has a first operational speed; and the second type of transistor has a second operational speed different from the first operational speed.

17. The device of claim 13, wherein:

the first gate and the first source/drain are implemented in a first region of the substrate;

the second gate and the second source/drain are implemented in a second region of the substrate; and the first region of the substrate and the second region of the substrate have different pattern densities.

18. The device of claim 13, further comprising:

a first gate spacer disposed between the first gate and the first source/drain; and a second gate spacer disposed between the second gate and the second source/drain; wherein the first gate spacer and the second gate spacer have substantially similar widths.

19. The device of claim 13, further comprising:

a first gate spacer disposed between the first gate and the first source/drain; and a second gate spacer disposed between the second gate and the second source/drain, wherein a width of the first gate spacer is equal to a width of the second gate spacer in the first horizontal direction.

20. The device of claim 13, further comprising:

an interlayer dielectric overlying the first source/drain and in contact with the first source/drain.

* * * * *